(12) United States Patent
Nakanishi et al.

(10) Patent No.: US 9,455,017 B2
(45) Date of Patent: Sep. 27, 2016

(54) STORAGE CONTROL DEVICE, STORAGE DEVICE, INFORMATION PROCESSING SYSTEM, AND STORAGE CONTROL METHOD

(71) Applicant: Sony Corporation, Tokyo (JP)

(72) Inventors: Kenichi Nakanishi, Tokyo (JP); Yasushi Fujinami, Tokyo (JP); Ken Ishii, Tokyo (JP); Hiroyuki Iwaki, Kanagawa (JP); Kentarou Mori, Kanagawa (JP)

(73) Assignee: Sony Corporation, Tokyo (JP)

( * ) Notice: Subject to any disclaimer, the term of this patent is extended or adjusted under 35 U.S.C. 154(b) by 118 days.

(21) Appl. No.: 14/189,362

(22) Filed: Feb. 25, 2014

(65) Prior Publication Data
US 2014/0258606 A1 Sep. 11, 2014

(30) Foreign Application Priority Data
Mar. 7, 2013 (JP) .................................. 2013-045125

(51) Int. Cl.
| | | |
|---|---|---|
| G06F 12/00 | (2006.01) | |
| G11C 11/406 | (2006.01) | |
| G11C 7/10 | (2006.01) | |
| G11C 11/408 | (2006.01) | |
| G11C 11/4096 | (2006.01) | |
| G06F 12/02 | (2006.01) | |

(52) U.S. Cl.
CPC ...... *G11C 11/40622* (2013.01); *G06F 12/0246* (2013.01); *G11C 7/109* (2013.01); *G11C 7/1063* (2013.01); *G11C 11/4082* (2013.01); *G11C 11/4096* (2013.01); *G06F 2212/7208* (2013.01)

(58) Field of Classification Search
CPC .......... G11C 11/40622; G11C 7/1063; G11C 7/109
See application file for complete search history.

(56) References Cited

U.S. PATENT DOCUMENTS

| | | | | |
|---|---|---|---|---|
| 2003/0131197 A1* | 7/2003 | Morrison | ............ | G06F 11/1004 711/130 |
| 2009/0172335 A1* | 7/2009 | Kulkarni | ................. | G06F 3/061 711/170 |
| 2011/0029741 A1* | 2/2011 | Kuo | ..................... | G06F 12/0246 711/154 |

* cited by examiner

*Primary Examiner* — Gurtej Bansal
(74) *Attorney, Agent, or Firm* — Chip Law Group

(57) ABSTRACT

A storage control device includes: a partial unit buffer configured to hold at least one data assigned to a partial unit, in which the partial unit is one of a plurality of partial units that are each a division of a write unit for a memory; and a request generation section configured to generate, upon indication of a busy state in the memory for any of the partial units, a write request for the write unit of the memory when the holding of the data assigned to that partial unit is possible in the partial unit buffer.

9 Claims, 24 Drawing Sheets

| Bufstat | Busy0 | Busy1 | Busy2 | Busy3 | Busy | DESCRIPTION |
|---|---|---|---|---|---|---|
| L (empty) | L (ready) | L (ready) | L (ready) | L (ready) | L (ready) | "READY STATE" IF THE BUFFER IS EMPTY, AND ALL THE BANKS ARE READY |
| | H (busy) | L (ready) | L (ready) | L (ready) | L (ready) | "READY STATE" IF THE BUFFER IS EMPTY, AND ONLY ONE BANK IS BUSY |
| | L (ready) | H (busy) | L (ready) | L (ready) | | |
| | ⋮ | ⋮ | ⋮ | ⋮ | | |
| | H (busy) | H (busy) | L (ready) | L (ready) | H (busy) | "BUSY STATE" IF THE BUFFER IS EMPTY, BUT TWO BANKS OR MORE ARE BUSY |
| | ⋮ | ⋮ | ⋮ | ⋮ | | |
| H (full) | L (ready) | L (ready) | L (ready) | L (ready) | H (busy) | "BUSY STATE" IF THE BUFFER IS FULL |
| | ⋮ | ⋮ | ⋮ | ⋮ | | |

FIG. 17

STORAGE CONTROL DEVICE, STORAGE DEVICE, INFORMATION PROCESSING SYSTEM, AND STORAGE CONTROL METHOD

CROSS REFERENCE TO RELATED APPLICATIONS

This application claims the benefit of Japanese Priority Patent Application JP 2013-045125 filed on Mar. 7, 2013, the entire contents of which are incorporated herein by reference.

BACKGROUND

The present technology relates to a storage control device. More specifically, the present technology relates to a storage control device, a storage device, and an information processing system for a memory, as well as to a processing method in such devices and system.

In an information processing system, a DRAM (Dynamic Random Access Memory) and the like are used as a work memory. Such a DRAM is typically a volatile memory, and storage contents thereof disappear once power supply is stopped. Meanwhile, in recent years, a non-volatile memory (NVM) has become widely used. Such a non-volatile memory falls into the general classification of a flash memory corresponding to a data access in the unit of a large size and a non-volatile random access memory (NVRAM) that enables a high-speed random access in the unit of a small size. Here, a typical example of the flash memory may include a NAND-type flash memory. On the other hand, examples of the non-volatile random access memory may include a ReRAM (Resistance RAM), a PCRAM (Phase-Change RAM), an MRAM (Magnetoresistive RAM), and the like.

In a processing of data write to a memory cell, a non-volatile memory assumes a writing step that writes data to a memory cell and a verifying step that reads data from the memory cell and performs verification by comparing the read data with the write data. At the time of write to the memory cell, these steps are repeated until data matching is confirmed from a result of comparison of data in the verifying step following the writing step. Since the memory cell has a certain range of variation in the characteristics, and the similar variation is also found in the number of these steps, a busy time arising during a write operation does not become a fixed period of time. Accordingly, for a write busy time of the non-volatile memory, a typical value and a maximum value are specified as a general rule. The typical value is determined by the average frequency of success in verification during a write operation, while the maximum value is determined by the maximum frequency of repetition of the writing step and the verifying step. If these steps are repeated up to the maximum number of times, a memory cell that fails in the verification may be often judged to be a defective cell.

Due to such a variation in the writing time, the write performance of the non-volatile memory is deteriorated by a cell with a long writing time. Typically in the non-volatile memory, a write operation is carried out to a write unit often referred to as a page that is configured of a plurality of memory cells concurrently. Consequently, even if only a few memory cells in the page have a long writing time due to the above-described variation, it is difficult to start a write to the next page until a write to such memory cells is completed, resulting in deterioration in the overall write processing performance. The same is true for a non-volatile memory employing a multi-bank configuration that has a plurality of non-volatile memory banks using a page as a writing unit. A page writing time of a certain bank is increased due to a variation, and thereby any other banks that have already completed a write operation are put in a state of waiting for a start of write to the next page until such a bank completes its write operation, resulting in deterioration in the write performance of the overall non-volatile memory. More specifically, in either case, although a page of a bank that has already completed a write operation is put in a state capable of starting a write operation if only it receives the next data, the next data entry remains in a standby state until all the banks complete write operation thereof, causing the write performance to degrade.

On the contrary, a method has been proposed that prevents a data transfer time from being an overhead on a start of the next write operation by transferring the next write data to a buffer internal to a non-volatile memory during write busy time (for example, see Japanese Unexamined Patent Application Publication No. 2003-196989). Further, also for a multi-bank configuration, a method has been proposed that reduces an overhead on a start of write operation by providing a buffer for each bank (for example, see Japanese Unexamined Patent Application Publication No. 2007-080475).

SUMMARY

However, in the existing technology that transfers write data to a buffer during a write busy time, it is difficult to prevent a decrease in speed that is caused by an increased write busy time. Further, also in the existing technology that provides a buffer for each bank, the same effect as above is only obtained for a decrease in speed that is caused by an increased write busy time. Additionally, this existing technology involves a page-sized buffer for each bank, and is disadvantageous in that with an increase in a size of a page as a write unit and the number of banks in a non-volatile memory, each buffer increases in size.

In a currently-available non-volatile memory that is typified by a flash memory, a typical value of a busy time may be in the order of about several hundred microseconds to a few milliseconds, and the busy time does not vary as multiples of the typical value, but varies in the finer time unit. Accordingly, a time of the typical value is more predominant than a varying length of time, and an effect of improvement in the performance that is achieved by absorbing such a variation is not so large. On the contrary, in the NVRAM that is a new high-speed non-volatile memory, because the write busy time may be as small as a value in the order of about several dozen nanoseconds to a few microseconds, and a variation in the busy time is also equivalent to a time of length in almost the same order, an effect of a variation in the busy time on the write performance is significantly profound. Further, since a page size as a write unit is small, and a high-speed interface is provided, a busy time that is allowed to be concealed by providing a buffer as described above also becomes significantly short.

It is desirable to provide a technology that continues a write processing operation to the extent possible even when a part of write unit is put in a busy state.

According to an embodiment of the present technology, there is provided a storage control device including: a partial unit buffer configured to hold at least one data assigned to a partial unit, the partial unit being one of a plurality of partial units that are each a division of a write unit for a memory;

and a request generation section configured to generate, upon indication of a busy state in the memory for any of the partial units, a write request for the write unit of the memory when the holding of the data assigned to that partial unit is possible in the partial unit buffer. This brings a function of generating the write request to the extent possible even when the partial unit indicating the busy state is present.

According to an embodiment of the present technology, there is provided a storage control method including: generating, upon indication of a busy state in a memory for any of partial units that are each a division of a write unit for the memory, a write request for the write unit of the memory when holding of data assigned to that partial unit is possible in a partial unit buffer; and performing a write control that, upon the generation of the write request, causes the partial unit buffer to hold the data assigned to the partial unit for which the busy state is indicated, and transfers to the memory the data assigned to the partial unit for which the busy state is not indicated. This brings a function of generating the write request to the extent possible even when the partial unit indicating the busy state is present.

Advantageously, the storage control device may further include a write control section configured to, upon the generation of the write request, cause the partial unit buffer to hold the data assigned to the partial unit for which the memory indicates the busy state, and transfer to the memory the data assigned to the partial unit for which the memory does not indicate the busy state. This brings a function of allotting the data in accordance with the busy state of the partial unit.

Advantageously, when subsequent data assigned to the partial unit for which the busy state is cancelled is held in the partial unit buffer, the write control section may transfer the subsequent data from the partial unit buffer to the memory. This brings a function of transferring the data from the partial unit buffer taking an opportunity of cancellation of the busy state for the partial unit.

Advantageously, the storage control device may further include a signal generation section configured to generate a signal that indicates: the busy state when the partial unit for which the busy state is indicated in the memory is present and the holding of the data assigned to that partial unit is not possible in the partial unit buffer; a ready state when the partial unit buffer is in an empty state and none of the partial units for which the busy state is indicated in the memory is present; and the ready state when the holding of, upon the presence of the partial unit for which the busy state is indicated in the memory, the data of that partial unit is possible in the partial unit buffer, and the request generation section may generate the write request for the write unit when the signal indicates the ready state. This brings a function of controlling the generation of the write request by utilizing the signal that indicates the presence or absence of the busy state.

According to an embodiment of the present technology, there is provided a storage device including: a memory cell array in which a write unit is divided into a plurality of partial units to store data; a partial unit buffer configured to hold at least one data assigned to a partial unit of the plurality of partial units; a request generation section configured to generate, upon indication of a busy state in the memory cell array for any of the partial units, a write request for the write unit of the memory cell array when the holding of the data assigned to that partial unit is possible in the partial unit buffer; and a write control section configured to, upon the generation of the write request, cause the partial unit buffer to hold the data assigned to the partial unit for which the busy state is indicated, and transfer to the memory cell array the data assigned to the partial unit for which the busy state is not indicated. This brings a function of generating the write request to the extent possible to allot the data in accordance with the busy state of the partial unit even when the partial unit for which the busy state is indicated is present.

Advantageously, the memory cell array may include a memory cell having a non-volatile memory element.

According to an embodiment of the present technology, there is provided an information processing system including: a memory cell array in which a write unit is divided into a plurality of partial units to store data; a host computer configured to issue a write command for the write unit; a partial unit buffer configured to hold at least one data assigned to a partial unit of the plurality of partial units; a request generation section configured to generate, upon indication of a busy state in the memory cell array for any of the partial units, a write request for the write unit of the memory cell array when the holding of the data assigned to that partial unit is possible in the partial unit buffer, upon the issuance of the write command; and a write control section configured to, upon the generation of the write request, cause the partial unit buffer to hold the data assigned to the partial unit for which the busy state is indicated, and transfer to the memory cell array the data assigned to the partial unit for which the busy state is not indicated. This brings a function of generating the write request to the extent possible to allot data in accordance with the busy state of the partial unit even when the partial unit for which the busy state is indicated is present when the write command is issued.

According to the above-described embodiments of the present technology, it is possible to achieve a prominent effect of being capable of continuing a write processing operation to the extent possible even when a part of the write unit is put in a busy state.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

FIG. 17 is a truth table of a busy signal generation circuit 351 according to the third embodiment of the present technology.

DETAILED DESCRIPTION

Hereinafter, the description is provided on some embodiments of the present technology (hereinafter referred to as "embodiment(s)").

[Configuration of Information Processing System]

Figure 1:
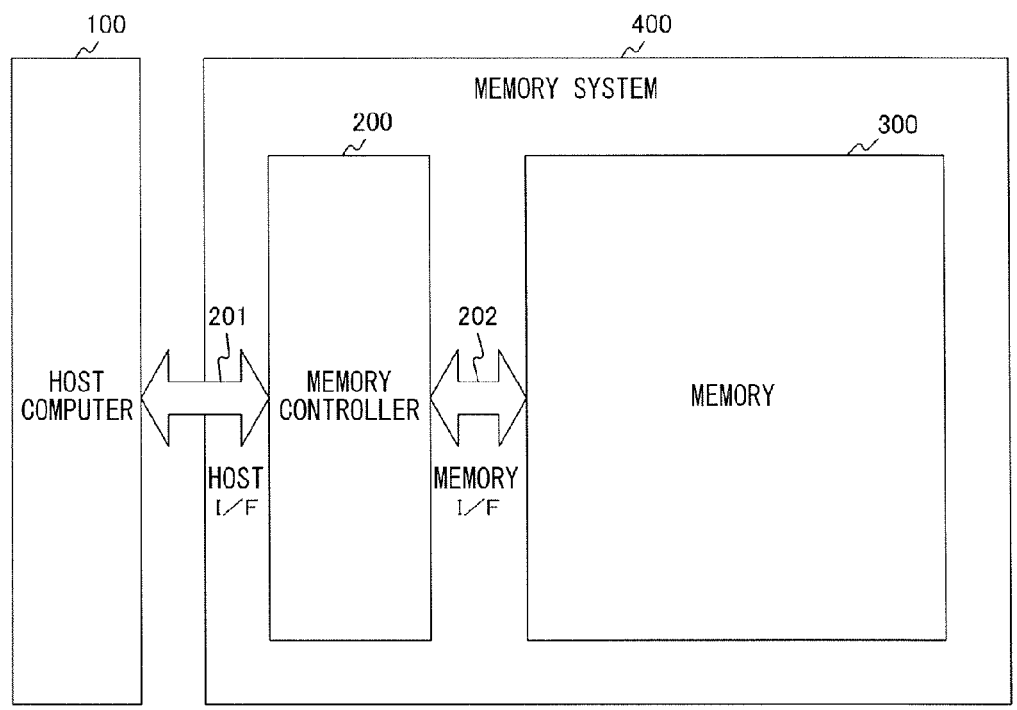
FIG. 1 is a schematic block diagram showing a configuration example of an information processing system according to an embodiment of the present technology.

FIG. 1 is a schematic block diagram showing a configuration example of an information processing system according to an embodiment of the present technology. This information processing system is configured of a host computer 100 and a memory system 400. The memory system 400 is configured of a memory 300 and a memory controller 200.

The host computer 100 issues commands requesting data read/write and the like from the memory system 400. In this embodiment of the present technology, attention is mainly focused on issuance of a write command.

It is assumed that the memory 300 is configured of a non-volatile memory, and is specifically a non-volatile random access memory (NVRAM) which enables high-speed random access in a small unit. Examples of the NVRAM may include a resistance-change ReRAM, a phase-change PCRAM, a magnetoresistive-change MRAM, and the like.

The memory controller 200 controls the memory 300 in response to a request from the host computer 100. In this memory controller 200, an interface (I/F) between the host computer 100 side is referred to as a host interface 201, and an interface between the memory 300 side is referred to a memory interface 202.

Figure 2:
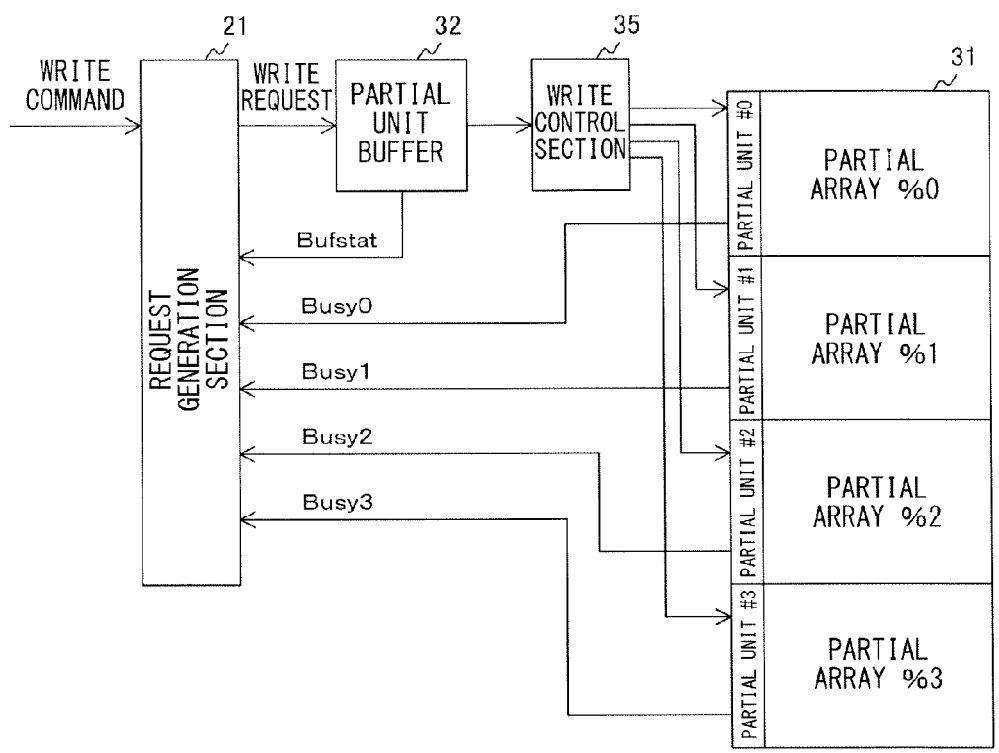
FIG. 2 is a schematic block diagram showing a functional configuration example according to an embodiment of the present technology.

FIG. 2 is a schematic block diagram showing a functional configuration example according to this embodiment of the present technology. FIG. 2 shows a memory cell array 31, a partial unit buffer 32, a request generation section 21, and a write control section 35. The memory cell array 31 is arranged in the memory 300. The partial unit buffer 32, the request generation section 21, and the write control section 35 are arranged in the memory 300 or the memory controller 200.

The memory cell array 31 is an assembly of memory cells that are configured of non-volatile memories, and is configured to enable writing of a single write unit at a time. In this example, the memory cell array 31 is divided into four partial arrays 0 to 3, and data assigned to each partial unit that is a four-divided write unit is written separately from each other. Busy status of the partial arrays 0 to 3 in the memory cell array 31 are provided to the request generation section 21 as Busy 0 to 3 signals, respectively.

The partial unit buffer 32 is a buffer for holding data assigned to a partial unit that is a divided write unit. When a request of write to the memory cell array 31 is generated, if the memory cell array 31 indicates a busy state for a part of the partial units in the write unit, data assigned to such a partial unit is held in the partial unit buffer 32. On the other hand, data assigned to a partial unit for which the memory cell array 31 indicates a ready state is transferred to the memory cell array 31. A data holding state of the partial unit buffer 32 is provided to the request generation section 21 as a Bufstat signal.

The request generation section 21 generates a request of write to the write unit in the memory cell array 31 on the basis of the Bufstat signal and Busy 0 to 3 signals when a write command is issued by the host computer 100. Even though the memory cell array 31 indicates a busy state for any of the partial units, if a state where data assigned to such a partial unit is allowed to be held in the partial unit buffer 32 is kept, the request generation section 21 generates a request of write to the write unit. In other words, when the Bufstat signal indicates a full state, the request generation section 21 does not generate a write request. Further, also when the Bufstat signal indicates an empty state, and at least two of the Busy 0 to 3 signals indicate a busy state, the request generation section 21 does not generate the write request similarly. On the other hand, when the Bufstat signal indicates an empty state, and not more than one of the Busy 0 to 3 signals indicates a busy state, the request generation section 21 generates the write request. It is to be noted that, when the request generation section 21 does not generate the write request, it is placed in a standby state until the Bufstat signal and the Busy 0 to 3 signals satisfy the above-described condition. In addition, it is assumed that a holding capacity of the partial unit buffer 32 is one partial unit in this example.

Upon generation of a request of write to the write unit, the write control section 35 controls data assigned to a partial unit. More specifically, the write control section 35 controls the partial unit buffer 32 to hold data assigned to a partial unit for which a partial array in the memory cell array 31 indicates a busy state. Further, the write control section 35 transfers data assigned to a partial unit for which a partial array in the memory cell array 31 indicates a ready state to the memory cell array 31. Subsequently, for a partial unit corresponding to a partial array for which a busy state is cancelled, when the next data is held in the partial unit buffer 32, the write control section 35 transfers such data from the partial unit buffer 32 to the memory cell array 31.

Hereinafter, some embodiments of the present technology are described on the assumption of the above-described information processing system and a functional configuration thereof. The descriptions on some embodiments of the present technology are provided in the order given below.
1. First Embodiment (an example where a write access on a page basis is divided into a write access on a subpage basis)
2. Second Embodiment (an example where a write access across banks is divided for each bank)
3. Third Embodiment (an example where busy signals are put together in a memory)
4. Fourth Embodiment (an example where a page buffer is managed at a memory controller side)
5. Fifth Embodiment (an example where a plurality of page buffers are shared by each bank)
6. Sixth Embodiment (an example where a page buffer is shared for each bank group)
(1. First Embodiment)
[Memory Configuration]

Figure 3:
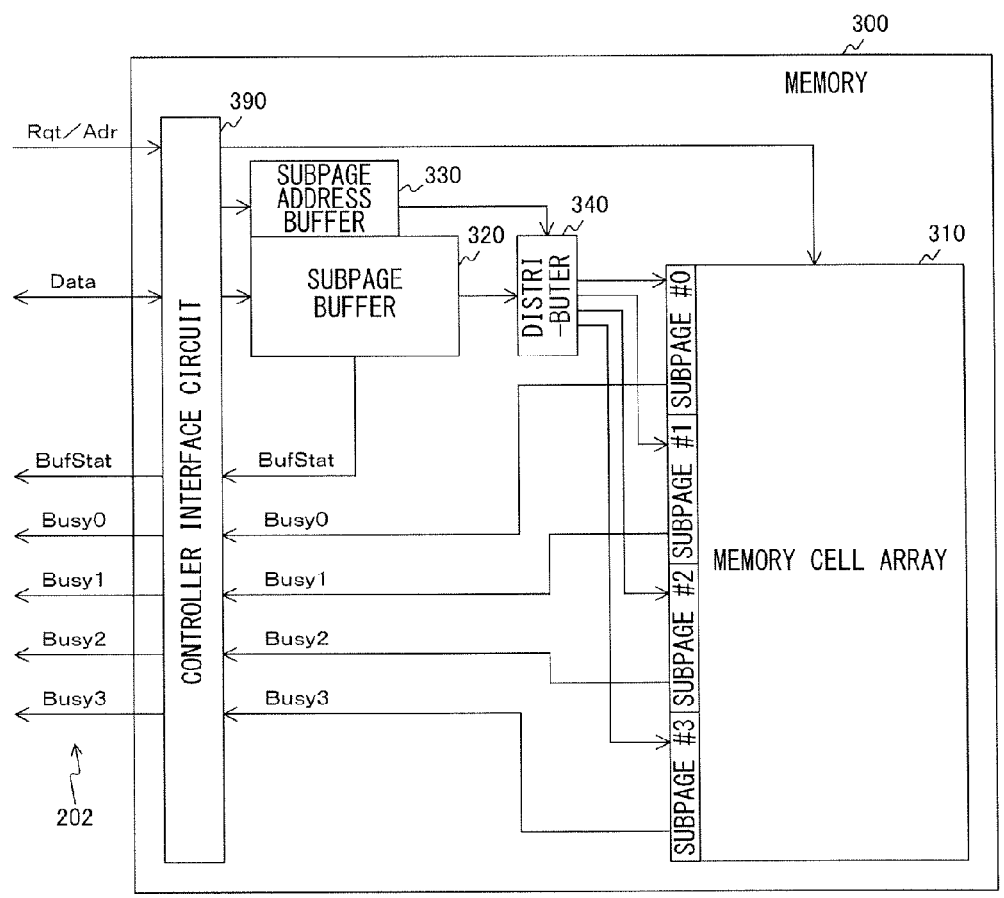
FIG. 3 is a schematic block diagram showing a configuration example of a memory 300 according to a first embodiment of the present technology.

FIG. 3 is a schematic block diagram showing a configuration example of a memory 300 according to a first embodiment of the present technology. The memory 300 includes a memory cell array 310, a subpage buffer 320, a subpage address buffer 330, a distributor 340, and a controller interface circuit 390.

The memory cell array 310 is an assembly of memory cells that are configured of non-volatile memories, and is configured to enable writing of a single page at a time. In this example, the memory cell array 310 is configured in such a manner that data assigned to each subpage that is a four-divided page is written separately from each other. Busy states for the respective subpages in the memory cell array 310 are provided to the controller interface circuit 390 as respective Busy 0 to 3 signals. In the first embodiment of the present technology, attention is focused on a variation in the write busy time for such a subpage that is a divided page.

The subpage buffer 320 is a buffer for holding data assigned to a subpage. When a request of write to the memory cell array 310 is generated, if the memory cell array 310 indicates a busy state for a part of the subpages in an overall page, data assigned to such a subpage is held in the subpage buffer 320. On the other hand, data assigned to a subpage for which the memory cell array 310 indicates a ready state is transferred to the memory cell array 310. A data holding state of the subpage buffer 320 is provided to the controller interface circuit 390 as a Bufstat signal.

The subpage address buffer 330 is a buffer for holding an address on the memory cell array 310 for data that is held in the subpage buffer 320. In other words, the subpage address buffer 330 indicates which subpage of which page data is assigned to.

The distributor 340 distributes data assigned to a subpage included in a page related to a write request or data assigned to a subpage that is held in the subpage buffer 320 to a corresponding subpage address on the memory cell array 310. In distributing the data assigned to the subpage included in the page related to the write request, an address related to the write request is referenced. In distributing the data assigned to the subpage that is held in the subpage buffer 320, an address that is held in the subpage buffer 320 is referenced.

The controller interface circuit 390 is a circuit responsible for interaction between a memory controller 200. The controller interface circuit 390 receives a write request that is generated by the memory controller 200 via a request/address signal line (Rqt/Adr) and a data signal line (Data). On the premise thereof, once a write command is issued by a host computer 100, the memory controller 200 generates a request of write to the write unit in the memory cell array 310 on the basis of the Bufstat signal and Busy 0 to 3 signals. In other words, when the Bufstat signal indicates a full state, the memory controller 200 does not generate a write request. Further, also when the Bufstat signal indicates an empty state, and at least two of the Busy 0 to 3 signals indicate a busy state, the memory controller 200 does not generate the write request similarly. On the other hand, when the Bufstat signal indicates an empty state, and not more than one of the Busy 0 to 3 signals indicates a busy state, the memory controller 200 generates the write request. It is to be noted that, when the memory controller 200 does not generate the write request, it is placed in a standby state until the Bufstat signal and the Busy 0 to 3 signals satisfy the above-described condition. In addition, the controller interface circuit 390 transmits the Bufstat signal and the Busy 0 to 3 signals to the memory controller 200.

Further, when a request of write to the write unit is generated by the memory controller 200, the controller interface circuit 390 controls data assigned to a subpage. More specifically, the controller interface circuit 390 controls the subpage buffer 320 to hold data assigned to a subpage for which a busy state is indicated in the memory cell array 310. Additionally, the controller interface circuit 390 transfers data assigned to a subpage for which a ready state is indicated in the memory cell array 310 to the memory cell array 310. Subsequently, for a subpage for which a busy state is cancelled, when the next data is held in the subpage buffer 320, the controller interface circuit 390 transfers such data from the subpage buffer 320 to the memory cell array 310.

It is to be noted that the memory cell array 31 is achieved by the memory cell array 310 as a function of the memory cell array 310 in the above-described functional configuration. The partial unit buffer 32 is achieved by the subpage buffer 320 as a function of the subpage buffer 320 in the above-described functional configuration. Further, the request generation section 21 is achieved by the memory controller 200 as a function of the memory controller 200 in the above-described functional configuration. Additionally, the write control section 35 is achieved by the controller interface circuit 390 and the distributor 340 as functions of the controller interface circuit 390 and the distributor 340 in the above-described functional configuration.

Figure 4:
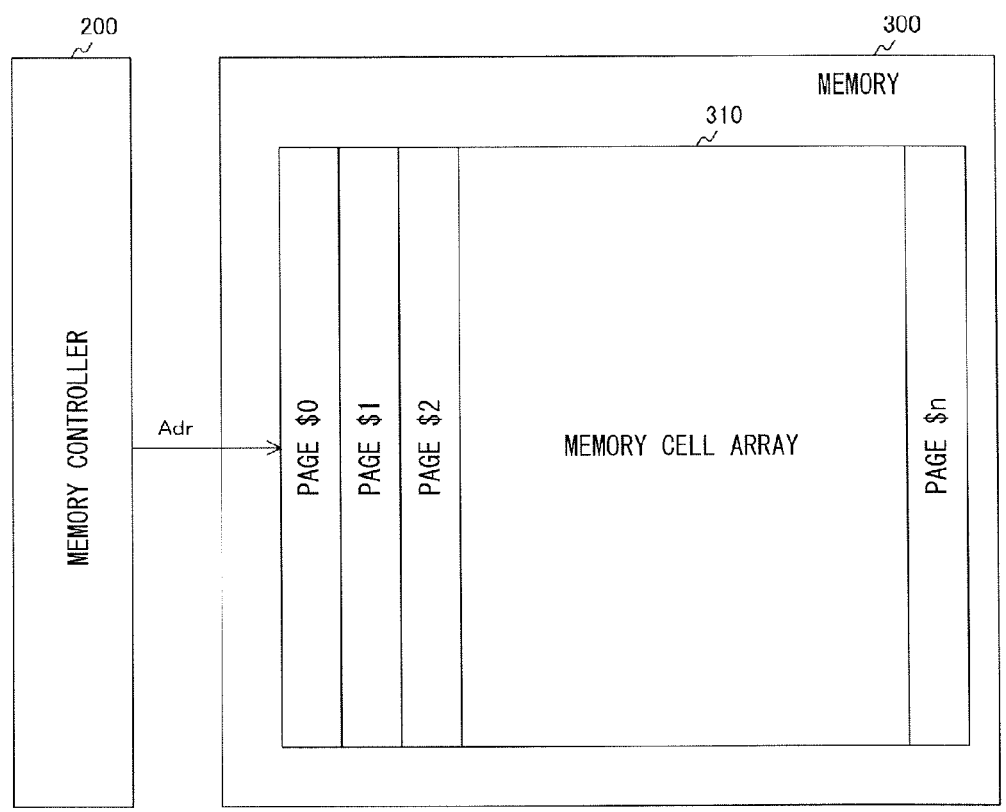
FIG. 4 is a schematic block diagram showing an assignment example of a page address for the memory 300 according to the first embodiment of the present technology.

FIG. 4 is a schematic block diagram showing an assignment example of a page address for the memory 300 according to the first embodiment of the present technology. In the memory 300 according to the first embodiment of the present technology, a whole memory space is a linear address space on a page basis. Those that are obtained by dividing the page into four are the subpages.

[Operation Timing]

Figure 5:
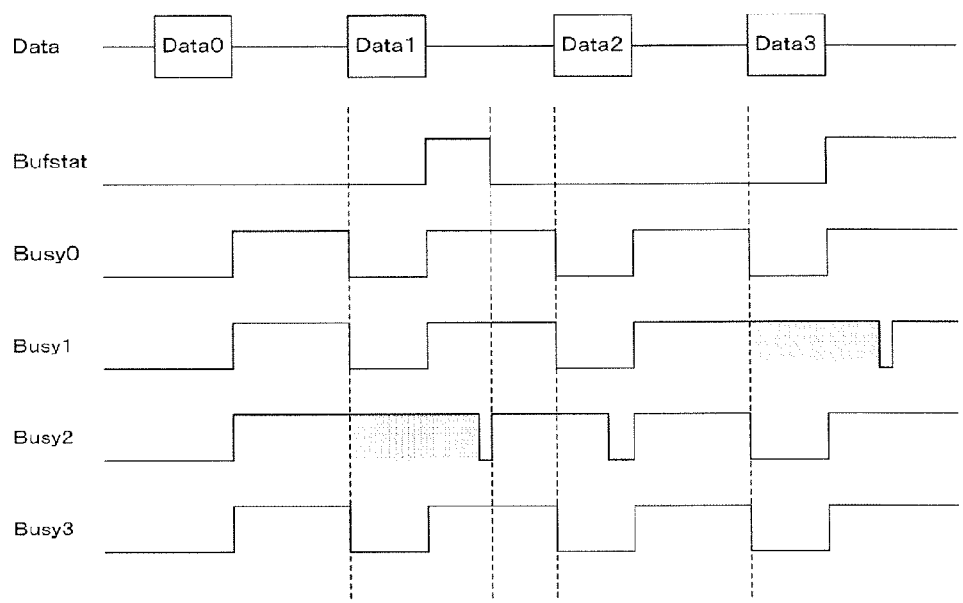
FIG. 5 is a timing chart showing an example of operation timing according to the first embodiment of the present technology.

FIG. 5 is a timing chart showing an example of operation timing according to the first embodiment of the present technology. FIG. 5 shows a consecutive page writing operation in such a manner that, for example, Data0, Data1, and Data2 that are transferred via the Data signal line are written to Page0, Page1, and Page2, respectively. Upon reception of the page data, the memory 300 starts a write processing operation concurrently on all the subpages, and the Busy 0 to 3 signals of all the subpages become a busy state indicating that a write operation is ongoing.

In this example, a write busy time of a subpage #2 increases in writing of the Data0, although by virtue of the presence of the subpage buffer 320, the next page data Data1 is transferred from the memory controller 200 to the memory 300 at a timing when a write operation of any other subpages is completed. At this time, data of the subpage #2 that is included in the Data1 is held in the subpage buffer 320, and address information indicating a writing destination of the data is held in the subpage address buffer 330. As a result, the Bufstat signal is changed into a High state indicating that the subpage buffer 320 is put in a full state.

Upon completion of writing of the Data0 to the subpage #2, the subpage data of the Data1 that is held on the subpage buffer 320 is immediately transferred to a location of the subpage #2 on the memory cell array 310 along with the address information, thereby starting the next processing operation. At this time, the Bufstat signal indicating a state of the empty subpage buffer 320 is changed into a Low state.

Although a write busy time of a subpage #1 increases in writing of the Data2, the subpage buffer 320 is put in an empty state, and thus the memory controller 200 transfers the next page data Data3 to the memory 300. The data of the subpage #1 that is included in the Data3 is held in the subpage buffer 320, and address information indicating a writing destination of the data is held in the subpage address buffer 330.

Figure 6A:
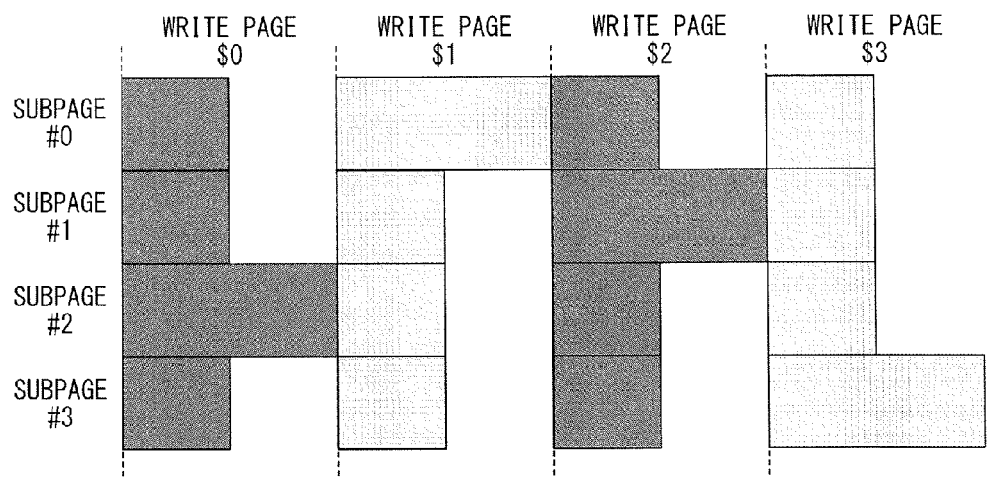
FIGS. 6A and 6B are each a schematic diagram showing an overview of an effect in the first embodiment of the present technology.
Figure 6B:
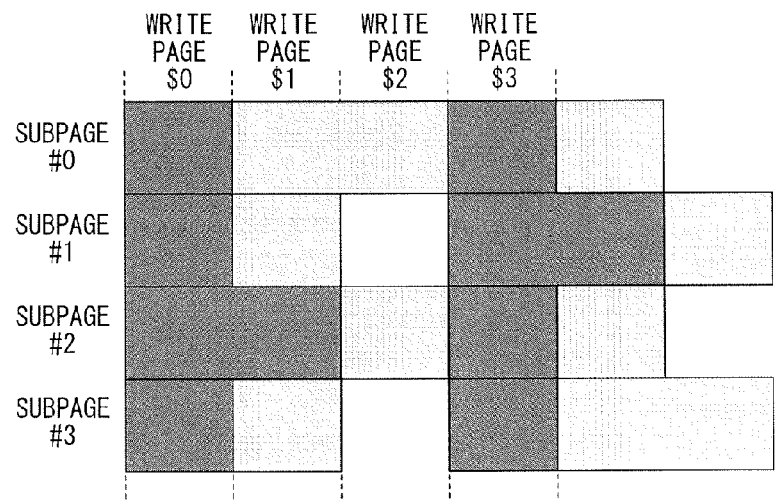

FIGS. 6A and 6B are each a schematic diagram showing an overview of an effect in the first embodiment of the present technology. It is to be noted that a time of data transfer to the memory cell array 310 and the subpage buffer 320 is not included in each drawing.

In each of the drawings, it is assumed that a write operation is carried out four times concurrently and consecutively to each page that is divided into four subpages. As illustrated in FIG. 6A, in an existing method, a write busy time of one subpage increases in each write operation, and an overall writing performance is determined by such a write time. Here, assuming that the busy time is twice the length of a typical busy time, this is equivalent to the busy time for eight times in all. On the other hand, if it is possible to receive data assigned to a subpage for which a write busy time increases on the subpage buffer 320, the next page data is allowed to be written to a subpage for which a write operation is previously completed. On the assumption that memory cells with longer write time don't concentrate on a single subpage, as illustrated in FIG. 6B, it is possible to complete a write operation in the busy time for six times, leading to the improvement in the performance.

[Processing Steps]

Figure 7:
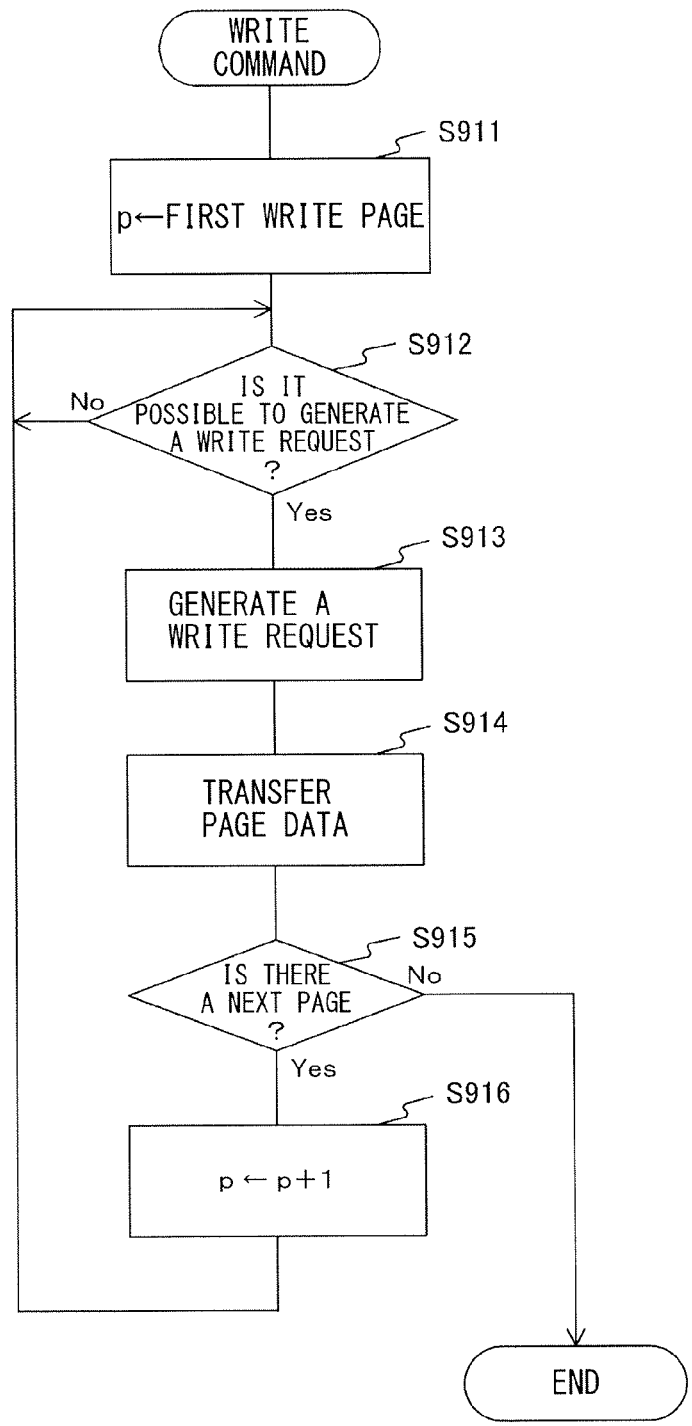
FIG. 7 is a flowchart showing an example of processing steps at the time of reception of a write command according to the first embodiment of the present technology.

FIG. 7 is a flowchart showing an example of processing steps at the time of reception of a write command according to the first embodiment of the present technology. This processing step at the time of reception of the write command is carried out by the memory controller 200. Here, it is assumed that data assigned to a single subpage is allowed to be held on the subpage buffer 320.

To begin with, a first page number related to the write command is set to a variable "p" (step S911). For this variable "p", a value that is incremented by one each time a processing operation for one page is completed is set up (step S916).

With reference to the Bufstat signal and the Busy 0 to 3 signals, the memory controller 200 determines whether or not to generate a write request (step S912). More specifically, when the Bufstat signal indicates a full state, the memory controller 200 determines to stand by instead of generating the write request. Further, also when the Bufstat signal indicates an empty state, and at least two of the Busy 0 to 3 signals indicate a busy state, the memory controller 200 determines to stand by instead of generating the write request similarly. On the other hand, when the Bufstat signal indicates an empty state, and not more than one of the Busy 0 to 3 signals indicates a busy state, the memory controller 200 determines to generate the write request.

When it is determined to stand by instead of generating the write request (step S912: No), the memory controller 200 stands by until a condition of generating the write request is satisfied. On the other hand, when it is determined to generate the write request (step S912: Yes), the memory controller 200 generates the write request on a page basis (step S913). On this occasion, a write request parameter is also transferred together. Subsequently, the page data is transferred to the memory 300 via the memory interface 202 from the memory controller 200 (step S914).

When a write command is also applied to a page following the processed page (step S915: Yes), the variable "p" is incremented by one (step S916), and a processing operation of the next page is repeated. When the write command is not applied to the next page (step S915: No), the processing step is completed.

Figure 8:
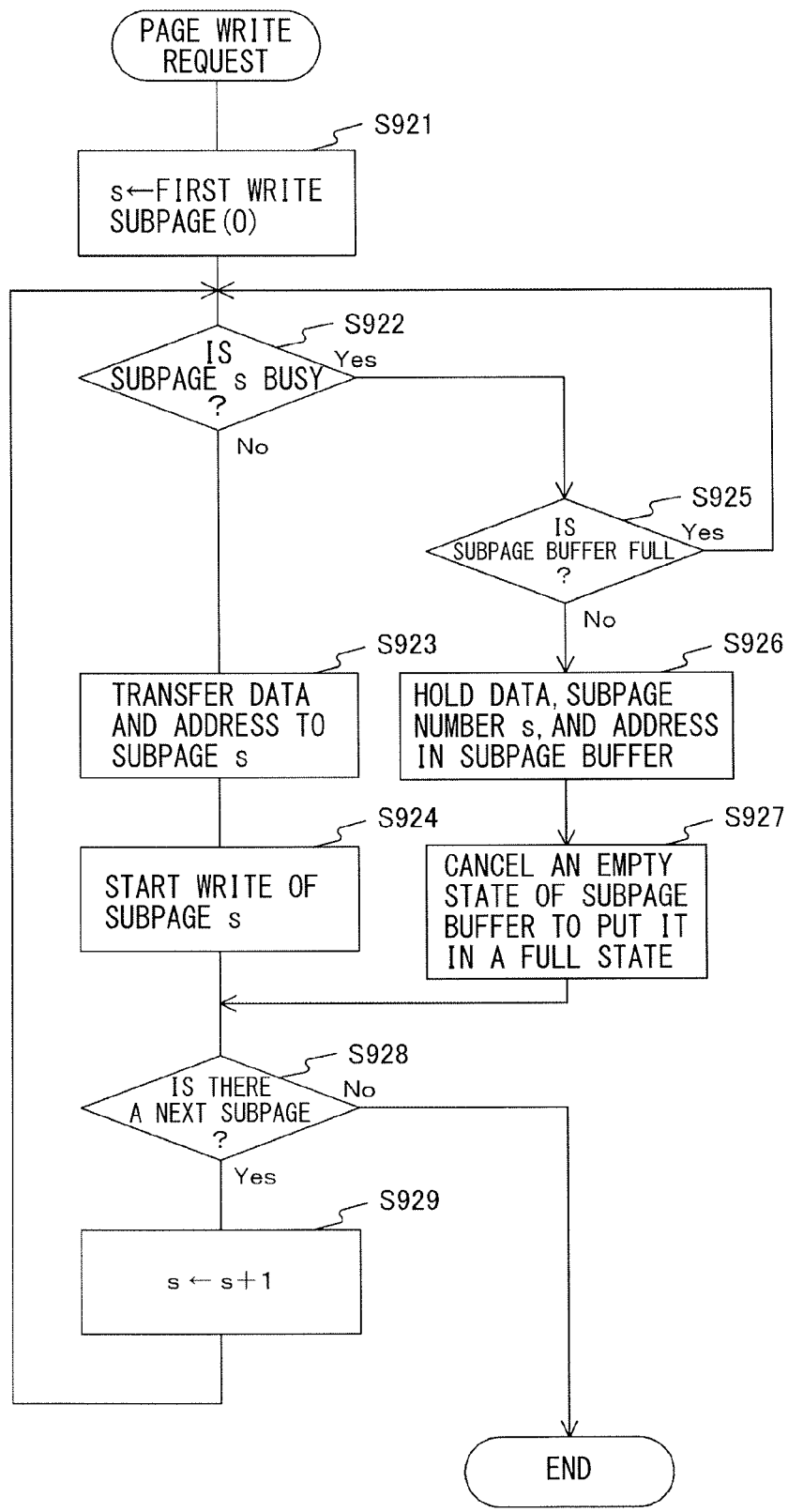
FIG. 8 is a flowchart showing an example of processing steps for a write request according to the first embodiment of the present technology.

FIG. 8 is a flowchart showing an example of processing steps for a write request according to the first embodiment of the present technology. This processing step for the write request is carried out by the controller interface circuit 390 and the distributor 340.

Upon generation of a write request, a first subpage number related to the write request is set to a variable "s" (step S921). Here, "0" is assumed as the first subpage number. For this variable "s", a value that is incremented by one each time a processing operation for one subpage is completed is set up (step S929).

If a subpage "s" is not put in a busy state in the memory cell array 310 (step S922: No), data and address are transferred to the memory cell array 310 (step S923), and a write operation of the subpage "s" is started (step S924).

On the contrary, when the subpage "s" is put in a busy state in the memory cell array 310 (step S922: Yes), it is determined whether the subpage buffer 320 is put in a full state or not (step S925). If the subpage buffer 320 is put in a full state (step S925: Yes), processing steps subsequent to the step S922 are repeated. If the subpage buffer 320 is not put in a full state (step S925: No), the data is held in the subpage buffer 320, and the subpage number "s" and the address are held in the subpage address buffer 330 (step S926). Thereafter, an empty state of the subpage buffer 320 is cancelled to put it in a full state (step S927). This puts the Bufstat signal in a full state.

When the write request is also applied to a subpage following the processed subpage (step S928: Yes), the variable "s" is incremented by one (step S929), and a processing operation of the next page is repeated. When the write request is not applied to the next page (step S928: No), the processing step is completed.

It is to be noted that, here for convenience sake, the description is provided on successive processing steps for each subpage, although the processing steps for each subpage may be alternatively performed in parallel with each other.

Figure 9:
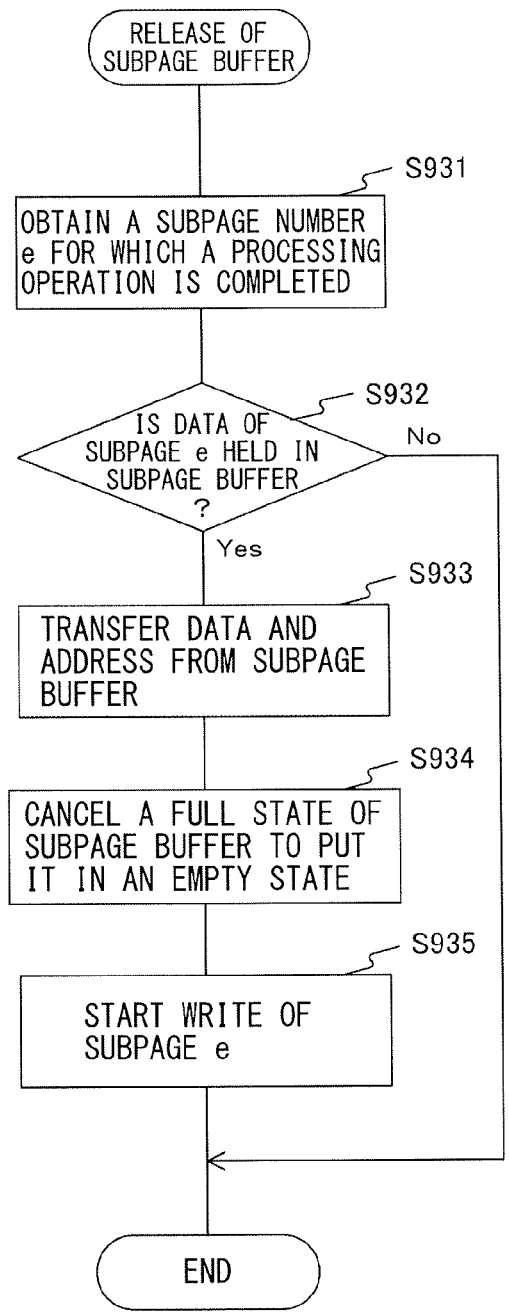
FIG. 9 is a flowchart showing an example of processing steps for releasing a subpage buffer 320 according to the first embodiment of the present technology.

FIG. 9 is a flowchart showing an example of processing steps for releasing the subpage buffer 320 according to the first embodiment of the present technology. This processing step for releasing the subpage buffer 320 is carried out by the controller interface circuit 390 and the distributor 340.

Upon completion of a write processing operation for any one of the subpages in the memory cell array 310, a subpage number "e" of the subpage for which the processing operation is completed is obtained (step S931). Further, when data assigned to the subpage "e" is held in the subpage buffer 320 (step S932: Yes), the following steps are performed.

The data is transferred from the subpage buffer 320, and the address is transferred from the subpage address buffer 330 (step S933). Subsequently, a full state of the subpage buffer 320 is cancelled to put it in an empty state (step S934). This puts the Bufstat signal in an empty state. Thereafter, a write processing operation for the subpage "e" is started in the memory cell array 310 (step S935).

On the contrary, when the data assigned to the subpage "e" is not held in the subpage buffer 320 (step S932: No), the processing operation is completed.

As described above, according to the first embodiment of the present technology, even when a busy state is indicated in the memory cell array 310 for a part of the subpages in a page to be subjected to writing, it is possible to continue a write processing operation as long as the subpage buffer 320 is available.

(2. Second Embodiment)
[Memory Configuration]

Figure 10:
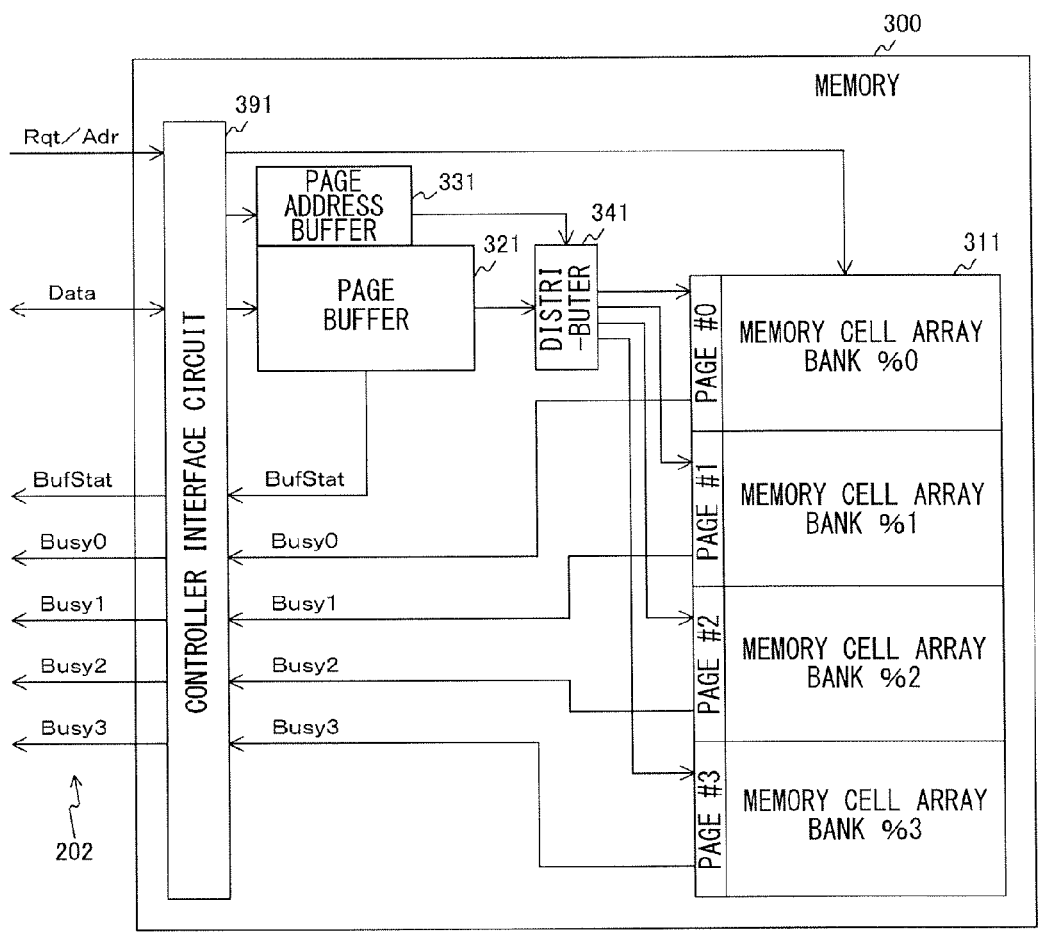
FIG. 10 is a schematic block diagram showing a configuration example of a memory 300 according to a second embodiment of the present technology.

FIG. 10 is a schematic block diagram showing a configuration example of a memory 300 according to a second embodiment of the present technology. The memory 300 includes a memory cell array 311, a page buffer 321, a page address buffer 331, a distributor 341, and a controller interface circuit 391.

The memory cell array 311 is an assembly of memory cells that are configured of non-volatile memories, and is configured to enable writing of a plurality of pages at a time. In this example, the memory cell array 311 is divided into four banks, and is configured in such a manner that each data for a single page is written separately from each other. Busy states for the respective banks in the memory cell array 311 are provided to the controller interface circuit 391 as respective Busy 0 to 3 signals. In the second embodiment of the present technology, attention is focused on a variation in the write busy time in such a multi-bank configuration.

The page buffer 321 is a buffer for holding data assigned to a page. When a request of write to the memory cell array 311 is generated, if the memory cell array 311 indicates a busy state for a part of the banks, data assigned to such a bank is held in the page buffer 321. On the other hand, data assigned to a bank for which the memory cell array 311 indicates a ready state is transferred to the memory cell array 311. A data holding state of the page buffer 321 is provided to the controller interface circuit 391 as a Bufstat signal.

The page address buffer 331 is a buffer for holding an address on the memory cell array 311 for data that is held in the page buffer 321. In other words, the page address buffer 331 indicates which page data is assigned to.

The distributor 341 distributes data assigned to a page related to a write request or data assigned to a page that is held in the page buffer 321 to a corresponding bank address on the memory cell array 311. In distributing the data assigned to the page related to the write request, an address related to the write request is referenced. In distributing the data assigned to the page that is held in the page buffer 321, an address that is held in the page buffer 321 is referenced.

The controller interface circuit 391 is a circuit responsible for interaction between a memory controller 200. The controller interface circuit 391 receives a write request that is generated by the memory controller 200 via a request/address signal line (Rqt/Adr) and a data signal line (Data). On the premise thereof, once a write command is issued by a host computer 100, the memory controller 200 generates a request of write to the write unit in the memory cell array 311 on the basis of the Bufstat signal and Busy 0 to 3 signals. In other words, when the Bufstat signal indicates a full state, the memory controller 200 does not generate a write request. Further, also when the Bufstat signal indicates an empty state, and at least two of the Busy 0 to 3 signals indicate a busy state, the memory controller 200 does not generate the write request similarly. On the other hand, when the Bufstat signal indicates an empty state, and not more than one of the Busy 0 to 3 signals indicates a busy state, the memory controller 200 generates the write request. It is to be noted that, when the memory controller 200 does not generate the write request, it is placed in a standby state until the Bufstat signal and the Busy 0 to 3 signals satisfy the above-described condition. In addition, the controller interface circuit 391 transmits the Bufstat signal and the Busy 0 to 3 signals to the memory controller 200.

Further, when a request of write to the write unit is generated by the memory controller 200, the controller interface circuit 391 controls data assigned to a page related to the write request. More specifically, the controller interface circuit 391 controls the page buffer 321 to hold data assigned to a page corresponding to a bank for which a busy state is indicated in the memory cell array 311. Additionally, the controller interface circuit 391 transfers data assigned to a page corresponding to a bank for which a ready state is indicated in the memory cell array 311 to the memory cell array 311. Subsequently, for a bank for which a busy state is cancelled, when the next data is held in the page buffer 321, the controller interface circuit 391 transfers such data from the page buffer 321 to the memory cell array 311.

It is to be noted that the memory cell array 31 is achieved by the memory cell array 311 as a function of the memory cell array 311 in the above-described functional configuration. The partial unit buffer 32 is achieved by the page buffer 321 as a function of the page buffer 321 in the above-described functional configuration. Further, the request generation section 21 is achieved by the memory controller 200 as a function of the memory controller 200 in the above-described functional configuration. Additionally, the write control section 35 is achieved by the controller interface circuit 391 and the distributor 341 as functions of the controller interface circuit 391 and the distributor 341 in the above-described functional configuration.

Figure 11:
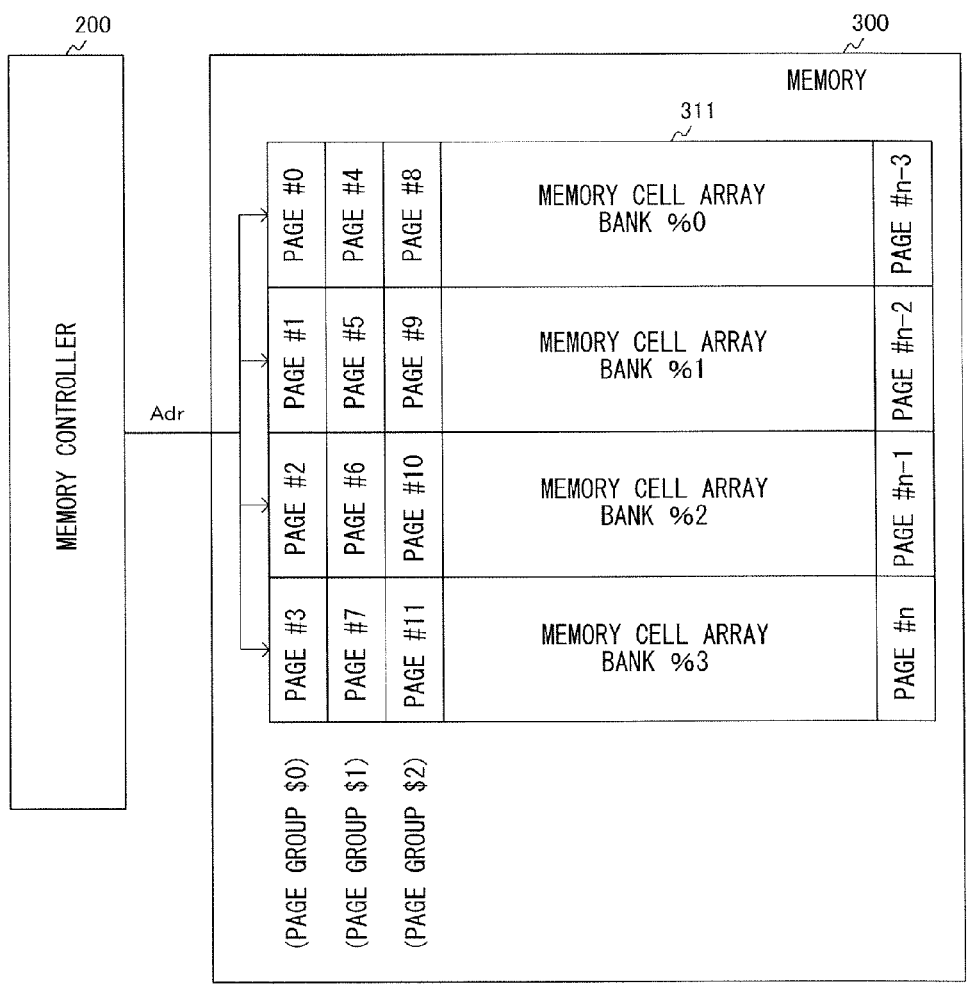
FIG. 11 is a schematic block diagram showing an assignment example of a page address for the memory 300 according to the second embodiment of the present technology.

FIG. 11 is a schematic block diagram showing an assignment example of a page address for the memory 300 according to the second embodiment of the present technology. In the memory 300 according to the second embodiment of the present technology, a memory space of each bank has an address space using a page as a common unit, and such an address space is considered from the outside as an address space that is repeated for each page column in a direction from a bank0 to a bank3. Therefore, at the time of a consecutive page write operation, a high-speed write operation is achieved in such a manner that four-page data is written to four banks concurrently.

Further, pages on an address location that is in common in each bank are referred to as a page group. For example, pages 0 to 3 belong to a page group 0, and pages 4 to 7 belong to a page group 1, while pages 8 to 11 belong to a page group 2.

[Operation Timing]

Figure 12:
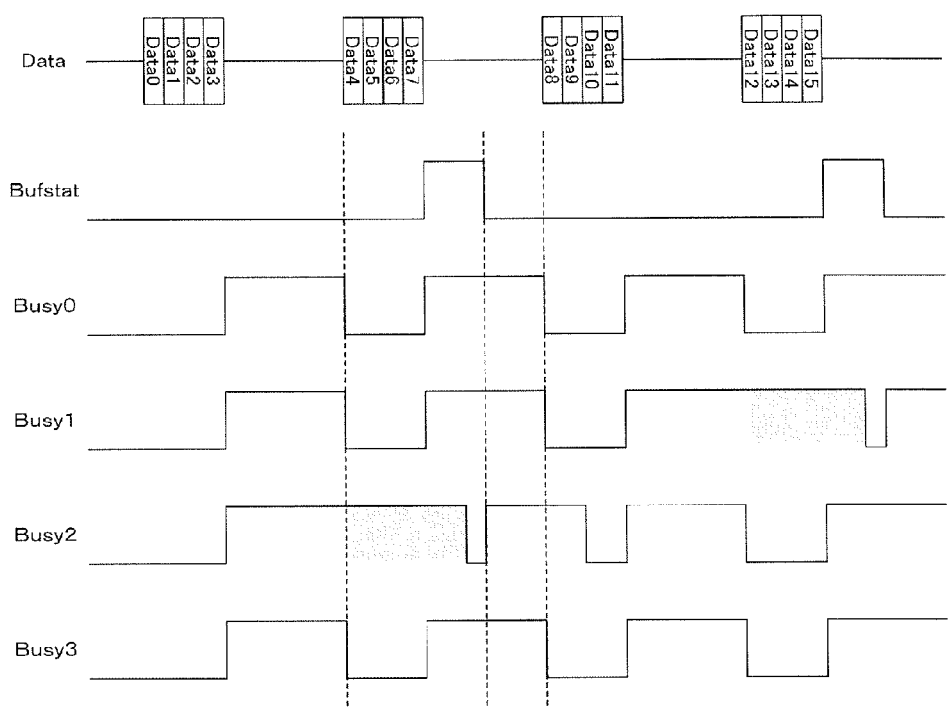
FIG. 12 is a timing diagram showing an example of operation timing according to the second embodiment of the present technology.

FIG. 12 is a timing chart showing an example of operation timing according to the second embodiment of the present technology. A consecutive page writing operation is carried out in such a manner that, for example, Data0, Data1, Data2, Data3, and Data4 that are transferred via the Data signal line are written to Bank0, Bank1, Bank2, Bank3, and Bank0, respectively. Upon reception of the write data on a four-page basis corresponding to all the banks, a write processing operation is started concurrently for pages of four banks, and the Busy 0 to 3 signals of all the pages become a busy state indicating that a write operation is ongoing.

In this example, a write busy time of the Data2 to be written to the Bank2 increases in writing of the page data Data0 Data3, although by virtue of the presence of the page buffer 321, the next page data Data4 to Data7 are transferred from the memory controller 200 to the memory 300 at a timing when a write operation of any other banks is completed. At this time, the Data6 that is page data to be written to the Bank2 is held in the page buffer 321, and information of the Bank2 as a writing destination of the data and page address information thereof is held in the page address buffer 331. As a result, the Bufstat signal is changed into a High state indicating that the page buffer 321 is put in a full state.

Upon completion of a write busy state of the Bank2 where the page data Data2 is being written, the next page data Data6 that is held in the page buffer 321 is immediately transferred to the Bank2 along with the page address information, thereby starting the next write processing operation. At this time, the Bufstat signal indicating a state of the empty page buffer 321 is changed into a Low state.

Although a write busy time of the Data9 to be written to the Bank1 increases in writing of the page data Data8 to Data11, the page buffer 321 has been already put in an empty state, and thus the memory controller 200 transfers the next page data Data12 to Data15 to the memory 300. At this time, the Data13 that is page data to be written to the Bank1 for which a write operation is ongoing is held in the page buffer 321, and information of the Bank1 as a writing destination of the data and page address information thereof is held in the page address buffer 331.

[Processing Steps]

Figure 13:
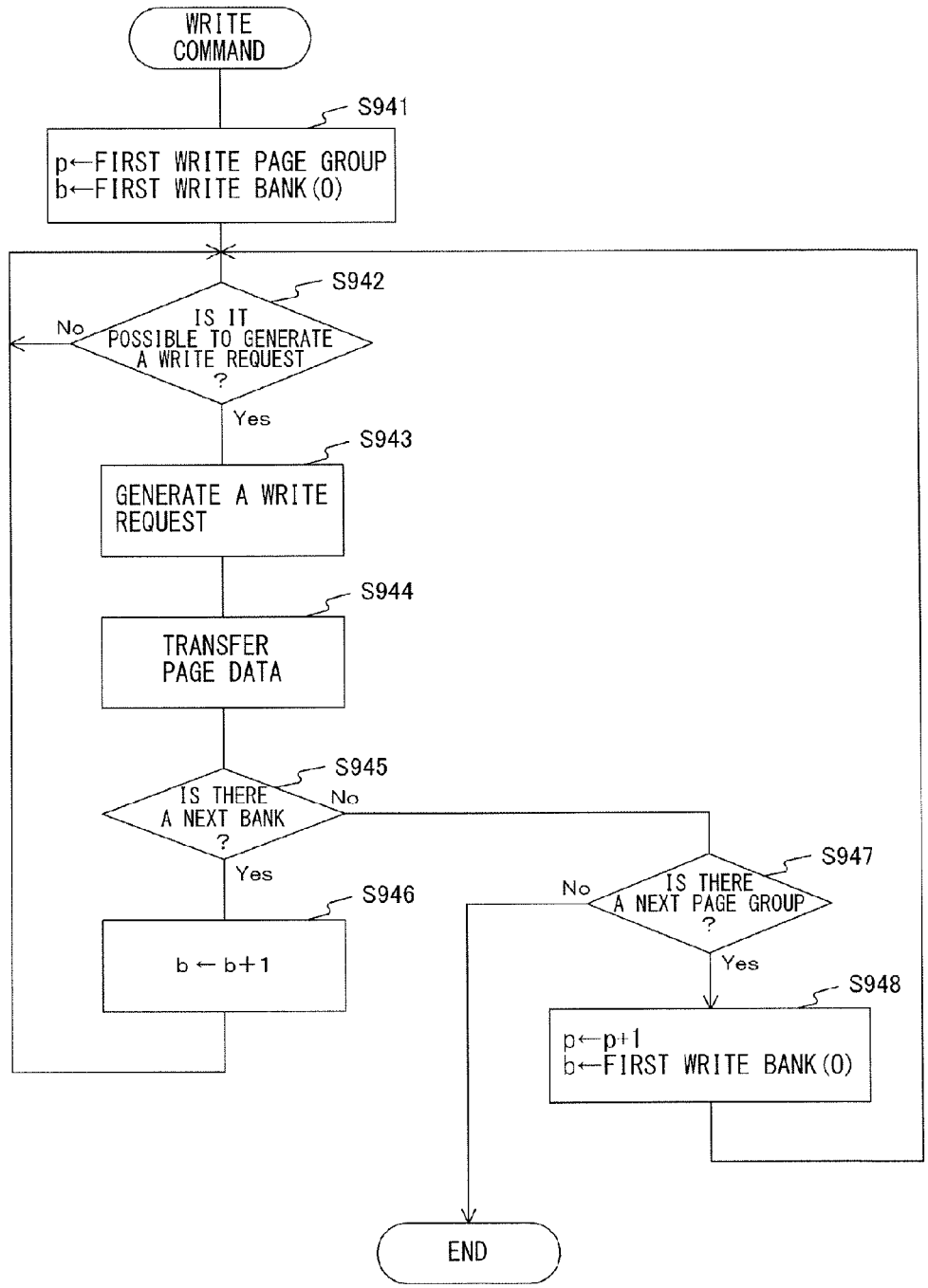
FIG. 13 is a flowchart showing an example of processing steps at the time of reception of a write command according to the second embodiment of the present technology.

FIG. 13 is a flowchart showing an example of processing steps at the time of reception of a write command according to the second embodiment of the present technology. This processing step at the time of reception of the write command is carried out by the memory controller 200. Here, it is assumed that data assigned to a single page is allowed to be held on the page buffer 321.

To begin with, a first page group number related to the write command is set to a variable "p", and "0" that is a first bank number for the banks to be written is set to a variable "b" (step S941). For the variable "b", a value that is incremented by one each time a processing operation for one bank is completed is set up (step S946). Further, for the variable "p", a value that is incremented by one each time a processing operation for one page group is completed is set up (step S948).

With reference to the Bufstat signal and the Busy 0 to 3 signals, the memory controller 200 determines whether or not to generate a write request (step S942). More specifically, when the Bufstat signal indicates a full state, the memory controller 200 determines to stand by instead of generating the write request. Further, also when the Bufstat signal indicates an empty state, and at least two of the Busy 0 to 3 signals indicate a busy state, the memory controller 200 determines to stand by instead of generating the write request similarly. On the other hand, when the Bufstat signal indicates an empty state, and not more than one of the Busy 0 to 3 signals indicates a busy state, the memory controller 200 determines to generate the write request.

When it is determined to stand by instead of generating the write request (step S942: No), the memory controller 200 stands by until a condition of generating the write request is satisfied. On the other hand, when it is determined to generate the write request (step S942: Yes), the memory controller 200 generates the write request on a page basis (step S943). On this occasion, a write request parameter is also transferred together. Subsequently, the page data is transferred (step S944).

When a page following the processed page is also within the same page group (step S945: Yes), the variable "b" is incremented by one (step S946), and a processing operation of the next page is repeated. When the next page is not within the same page group (step S945: No), it is determined whether or not a write command is applied to the next page group (step S947).

When the write command is applied to the next page group (step S947: Yes), the variable "p" is incremented by one, and "0" that is a first bank number is set to a variable "b" (step S948) to repeat a processing operation of the next page group. When the write command is not applied to the next page group (step S947: No), the processing step is completed.

It is to be noted that, here for convenience sake, the description is provided on successive processing steps for each bank, although the processing steps for each bank may be alternatively performed in parallel with each other.

Figure 14:
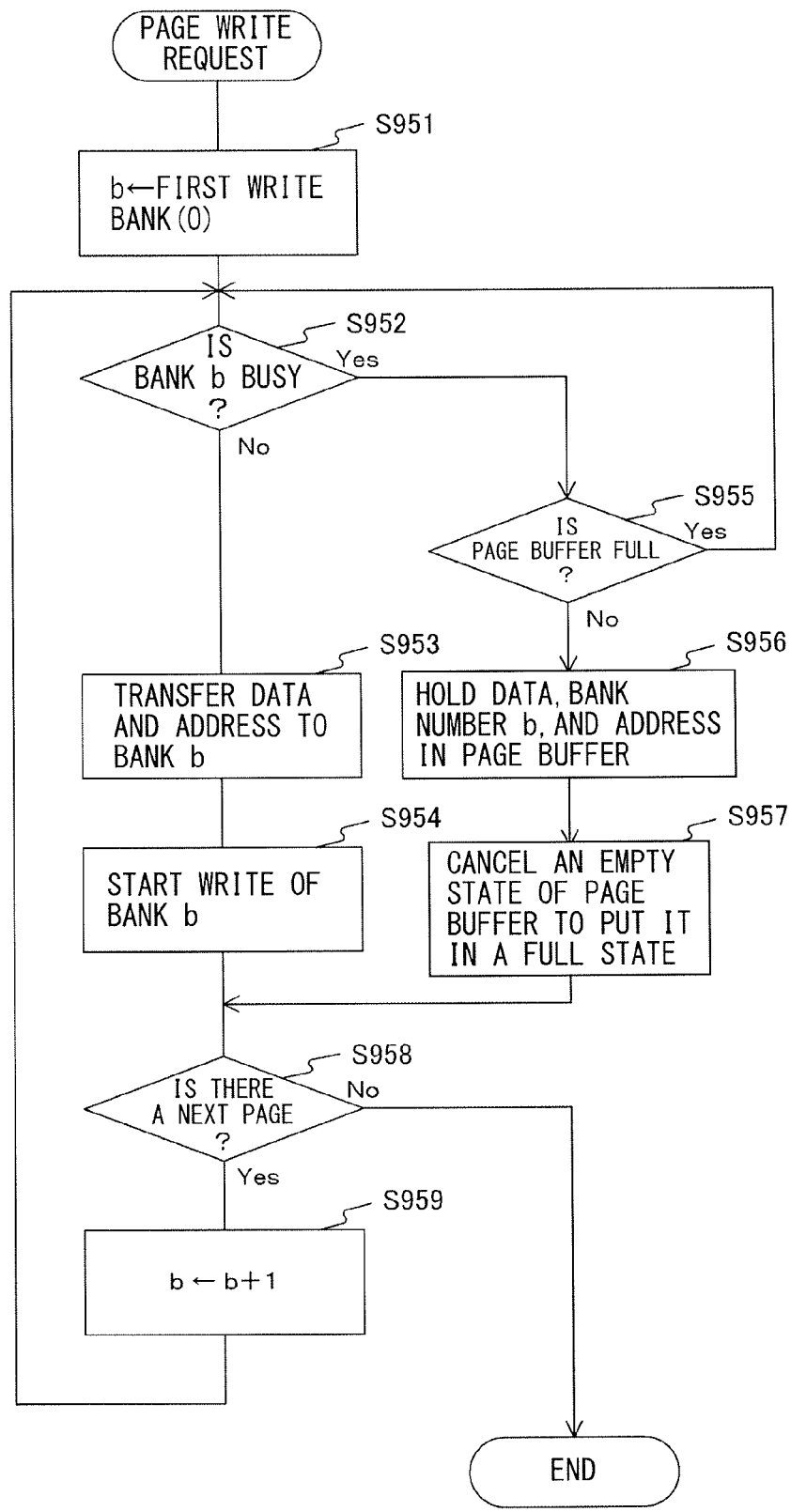
FIG. 14 is a flowchart showing an example of processing steps for a write request according to the second embodiment of the present technology.

FIG. 14 is a flowchart showing an example of processing steps for a write request according to the second embodiment of the present technology. This processing step for the write request is carried out by the controller interface circuit 391 and the distributor 341.

Upon generation of a write request, a first bank number related to the write request is set to the variable "b" (step S951). Here, "0" is assumed as the first bank number. For this variable "b", a value that is incremented by one each time a processing operation for one bank is completed is set up (step S959).

If a bank "b" is not put in a busy state in the memory cell array 311 (step S952: No), data and address are transferred to the memory cell array 311 (step S953), and a write operation of the bank "b" is started (step S954).

On the contrary, when the bank "b" is put in a busy state in the memory cell array 311 (step S952: Yes), it is determined whether the page buffer 321 is put in a full state or not (step S955). If the page buffer 321 is put in a full state (step S955: Yes), processing steps subsequent to the step S952 are repeated. If the page buffer 321 is not put in a full state (step S955: No), the data is held in the page buffer 321, and the bank number "b" and the address are held in the page address buffer 331 (step S956). Thereafter, an empty state of the page buffer 321 is cancelled to put it in a full state (step S957). This puts the Bufstat signal in a full state.

When the write request is also applied to a bank following the processed bank (step S958: Yes), the variable "b" is incremented by one (step S959), and a processing operation of the next bank is repeated. When the write request is not applied to the next bank (step S958: No), the processing step is completed.

It is to be noted that, here for convenience sake, the description is provided on successive processing steps for each bank, although the processing steps for each bank may be alternatively performed in parallel with each other.

Figure 15:
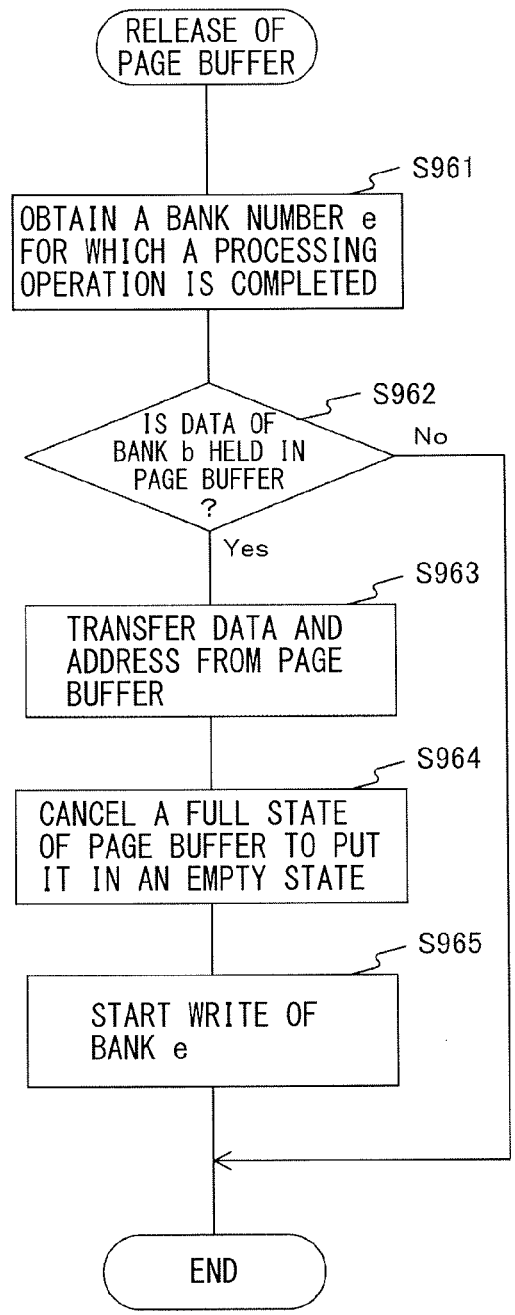
FIG. 15 is a flowchart showing an example of processing steps for releasing a page buffer 321 according to the second embodiment of the present technology.

FIG. 15 is a flowchart showing an example of processing steps for releasing the page buffer 321 according to the second embodiment of the present technology. This processing step for releasing the page buffer 321 is carried out by the controller interface circuit 391 and the distributor 341.

Upon completion of a write processing operation for any one of the banks in the memory cell array 311, a bank number "e" of the bank for which the processing operation is completed is obtained (step S961). Further, when data assigned to the bank "e" is held in the page buffer 321 (step S962: Yes), the following steps are performed.

The data is transferred from the page buffer 321, and the address is transferred from the page address buffer 331 (step S963). Subsequently, a full state of the page buffer 321 is cancelled to put it in an empty state (step S964). This puts the Bufstat signal in an empty state. Thereafter, a write processing operation for the bank "e" is started in the memory cell array 311 (step S965).

On the contrary, when the data assigned to the bank "e" is not held in the page buffer 321 (step S962: No), the processing operation is completed.

As described above, according to the second embodiment of the present technology, even when a busy state is indicated in the memory cell array 311 for a part of the pages to be subjected to writing, it is possible to continue a write processing operation as long as the page buffer 321 is available.

(3. Third Embodiment)
[Memory Configuration]

Figure 16:
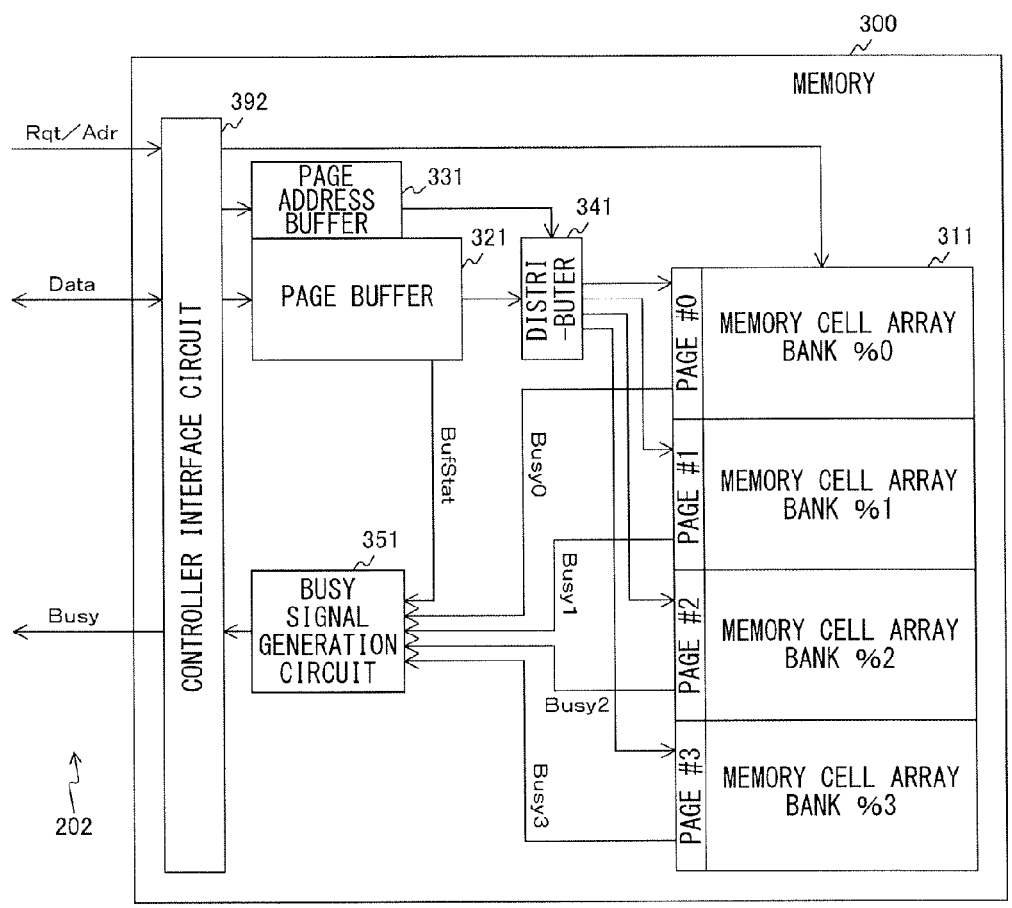
FIG. 16 is a schematic block diagram showing a configuration example of a memory 300 according to a third embodiment of the present technology.

FIG. 16 is a schematic block diagram showing a configuration example of a memory 300 according to a third embodiment of the present technology. The memory 300 includes a memory cell array 311, a page buffer 321, a page address buffer 331, a distributor 341, a controller interface circuit 392, and a busy signal generation circuit 351. The memory 300 according to the third embodiment of the present technology has an almost the same configuration as with the above-described second embodiment of the present technology with the exception of provision of the busy signal generation circuit 351.

Based on the Bufstat signal and the Busy 0 to 3 signals, the busy signal generation circuit 351 generates a Busy signal that is referenced in generating a write request. More specifically, when the Bufstat signal indicates a full state, the busy signal generation circuit 351 puts the Busy signal in a High state (busy state). Further, also when the Bufstat signal indicates an empty state, and at least two of the Busy 0 to 3 signals indicate a busy state, the busy signal generation circuit 351 puts the Busy signal in a High state (busy state) similarly. On the other hand, when the Bufstat signal indicates an empty state, and not more than one of the Busy 0 to 3 signals indicates a busy state, the busy signal generation circuit 351 puts the Busy signal in a Low state (ready state).

FIG. 17 shows a truth table of the Busy signal.

The Busy signal that is generated by the busy signal generation circuit 351 is provided to the memory controller 200 via the controller interface circuit 392. With reference to this Busy signal, the memory controller 200 determines whether to generate a write request for the next page group or not. More specifically, the memory controller 200 generates a write request if the Busy signal is put in a ready state, but does not generate a write request if the Busy signal is put in a busy state.

The third embodiment of the present technology includes the busy signal generation circuit 351. This makes it possible to provide the Bufstat signal and the Busy 0 to 3 signals via only a single signal line as compared with use of four signal lines in the second embodiment of the present technology. In other words, it is possible to reduce the number of signal lines for the memory interface 202.

It is to be noted that the memory cell array 31 is achieved by the memory cell array 311 as a function of the memory cell array 311 in the above-described functional configuration. The partial unit buffer 32 is achieved by the page buffer 321 as a function of the page buffer 321 in the above-described functional configuration. Further, the request generation section 21 is achieved by the memory controller 200 as a function of the memory controller 200 in the above-described functional configuration. Additionally, the write control section 35 is achieved by the controller interface circuit 392 and the distributor 341 as functions of the controller interface circuit 392 and the distributor 341 in the above-described functional configuration.

[Operation Timing]

Figure 18:
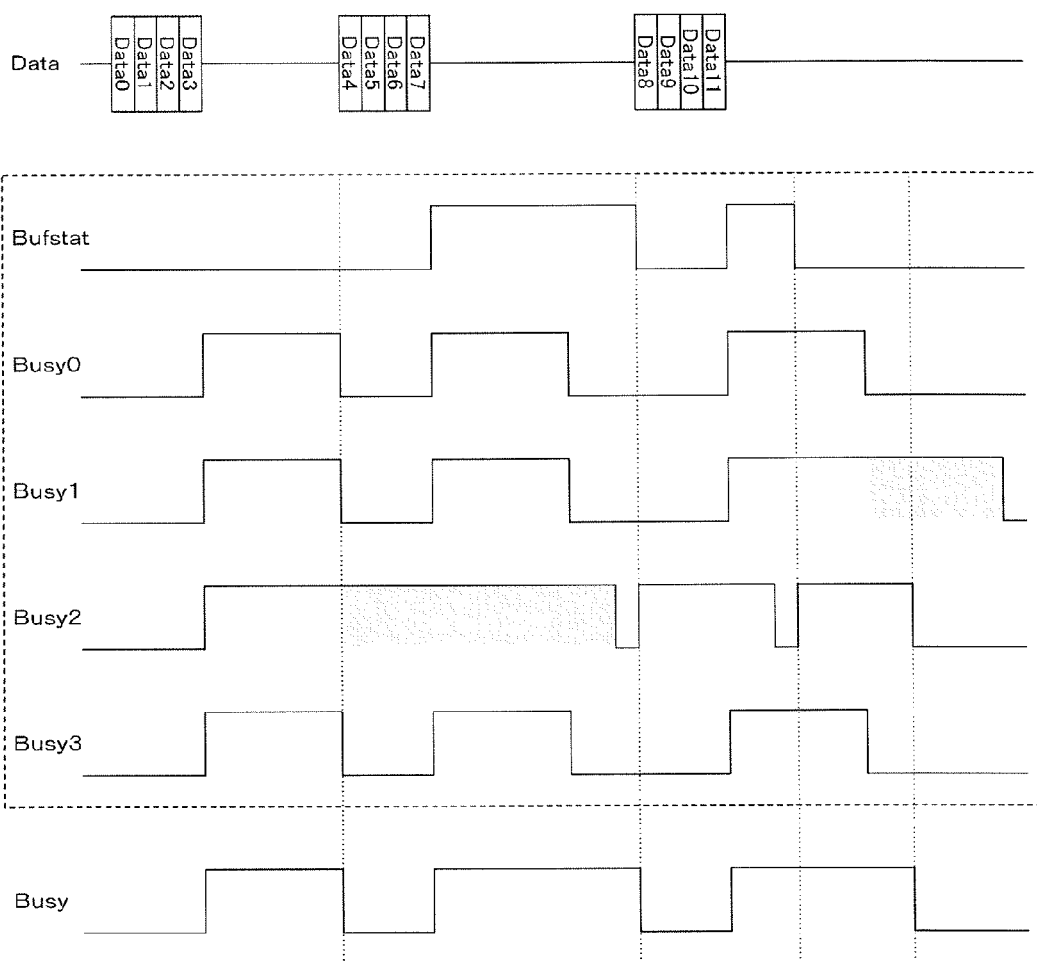
FIG. 18 is a timing diagram showing an example of operation timing according to the third embodiment of the present technology.

FIG. 18 is a timing chart showing an example of operation timing according to the third embodiment of the present technology. In the third embodiment of the present technology, the busy signal generation circuit 351 generates the Busy signal from the Bufstat signal and the Busy 0 to 3 signals. Accordingly, the memory controller 200 determines whether to generate a write request or not based on the Busy signal.

[Processing Steps]

Figure 19:
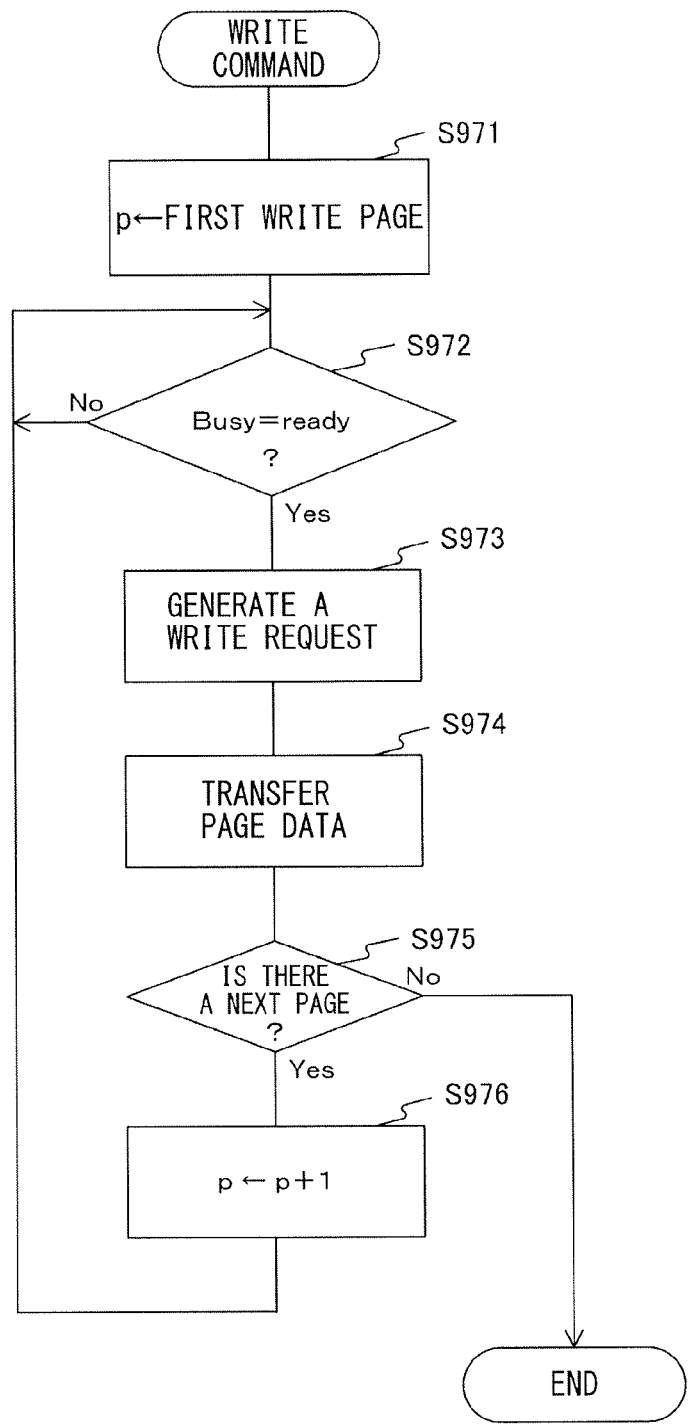
FIG. 19 is a flowchart showing an example of processing steps at the time of reception of a write command according to the third embodiment of the present technology.

FIG. 19 is a flowchart showing an example of processing steps at the time of reception of a write command according to the third embodiment of the present technology. This processing step at the time of reception of the write command is carried out by the controller interface circuit 392.

To begin with, a first page number related to the write command is set to a variable "p" (step S971). For the variable "p", a value that is incremented by one each time a processing operation for one page is completed is set up (step S976).

With reference to the Bufstat signal and the Busy 0 to 3 signals, the busy signal generation circuit 351 generates a Busy signal. Subsequently, with reference to this Busy signal, the memory controller 200 determines whether or not to generate a write request (step S972). More specifically, when the Bufstat signal indicates a full state, the memory controller 200 determines to stand by instead of generating the write request because the Busy signal remains in a busy state. Further, also when the Bufstat signal indicates an empty state, and at least two of the Busy 0 to 3 signals indicate a busy state, the memory controller 200 determines to stand by instead of generating the write request similarly because the Busy signal remains in a busy state. On the other hand, when the Bufstat signal indicates an empty state, and not more than one of the Busy 0 to 3 signals indicates a busy state, the memory controller 200 determines to generate the write request because the Busy signal is in a ready state.

When it is determined to stand by instead of generating the write request (step S972: No), the memory controller 200 stands by until a condition of generating the write request is satisfied. On the other hand, when it is determined to generate the write request (step S972: Yes), the memory controller 200 generates the write request on a page basis (step S973). On this occasion, a write request parameter is also transferred together. Subsequently, the page data is transferred (step S974).

When the write command is also applied to a page following the processed page (step S975: Yes), the variable "p" is incremented by one (step S976) to repeat a processing operation of the next page. When the write command is not applied to the next page (step S975: No), the processing step is completed.

Figure 20:
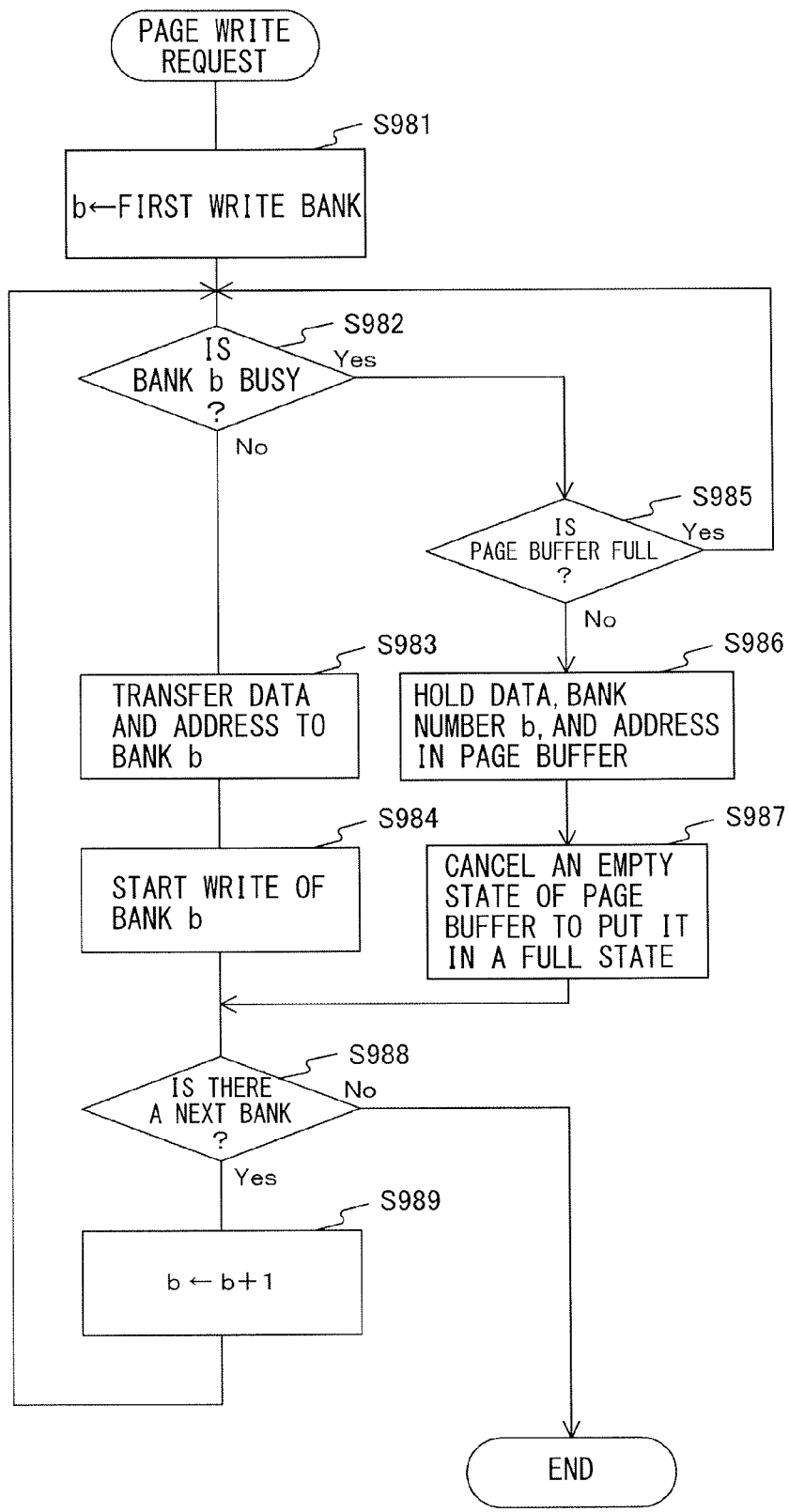
FIG. 20 is a flowchart showing an example of processing steps for a write request according to the third embodiment of the present technology.

FIG. 20 is a flowchart showing an example of processing steps for a write request according to the third embodiment of the present technology. This processing step for the write request is carried out by the controller interface circuit 392 and the distributor 341.

Upon generation of a write request, a first bank number related to the write request is set to a variable "b" (step S981). Here, "0" is assumed as the first bank number. For this variable "b", a value that is incremented by one each time a processing operation for one bank is completed is set up (step S989).

If a bank "b" is not put in a busy state in the memory cell array 311 (step S982: No), data and address are transferred to the memory cell array 311 (step S983), and a write operation of the bank "b" is started (step S984).

On the contrary, when the bank "b" is put in a busy state in the memory cell array 311 (step S982: Yes), it is determined whether the page buffer 321 is put in a full state or not (step S985). If the page buffer 321 is put in a full state (step S985: Yes), processing steps subsequent to the step S982 are repeated. If the page buffer 321 is not put in a full state (step S985: No), the data is held in the page buffer 321, and the bank number "b" and the address are held in the page address buffer 331 (step S986). Thereafter, an empty state of the page buffer 321 is cancelled to put it in a full state (step S987). This puts the Bufstat signal in a full state.

When the write request is also applied to a bank following the processed bank (step S988: Yes), the variable "b" is incremented by one (step S989), and a processing operation of the next bank is repeated. When the write request is not applied to the next bank (step S988: No), the processing step is completed.

It is to be noted that, here for convenience sake, the description is provided on successive processing steps for each bank, although the processing steps for each bank may be alternatively performed in parallel with each other.

Figure 21:
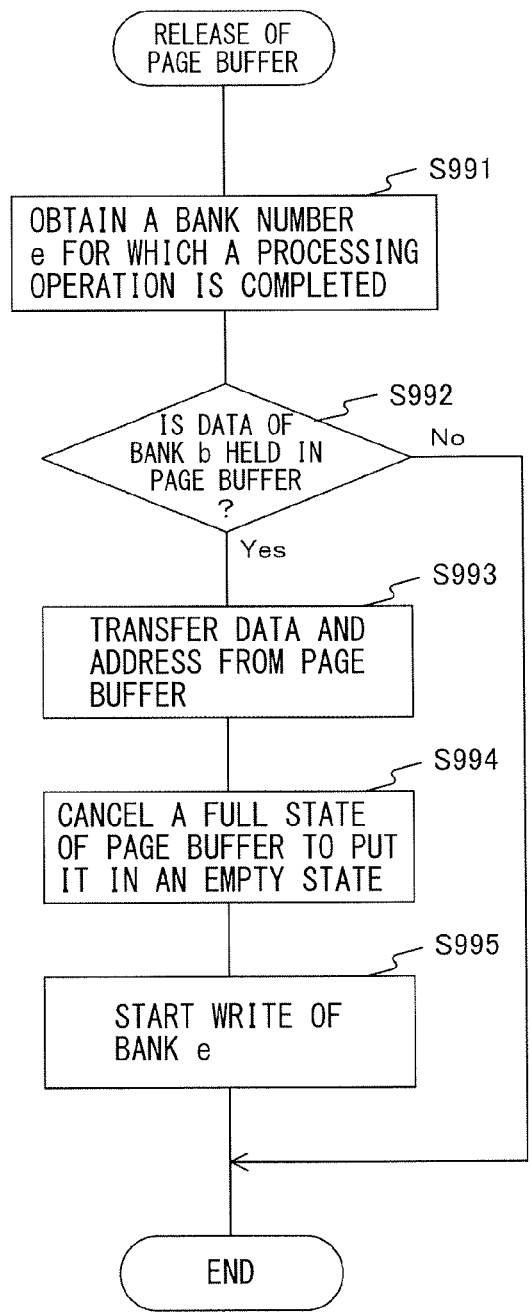
FIG. 21 is a flowchart showing an example of processing steps for releasing a page buffer 321 according to the third embodiment of the present technology.

FIG. 21 is a flowchart showing an example of processing steps for releasing the page buffer 321 according to the third embodiment of the present technology. This processing step for releasing the page buffer 321 is carried out by the controller interface circuit 392 and the distributor 341.

Upon completion of a write processing operation for any one of the banks in the memory cell array 311, a bank number "e" of the bank for which the processing operation is completed is obtained (step S991). Further, when data assigned to the bank "e" is held in the page buffer 321 (step S992: Yes), the following steps are performed.

The data is transferred from the page buffer 321, and the address is transferred from the page address buffer 331 (step S993). Subsequently, a full state of the page buffer 321 is cancelled to put it in an empty state (step S994). This puts the Bufstat signal in an empty state. Thereafter, a write processing operation for the bank "e" is started in the memory cell array 311 (step S995).

On the contrary, when the data assigned to the bank "e" is not held in the page buffer 321 (step S992: No), the processing operation is completed.

As described above, according to the third embodiment of the present technology, provision of the busy signal generation circuit 351 in a multi-bank configuration makes it possible to reduce the number of the signal lines for the memory interface 202.

(4. Fourth Embodiment)
[Memory Configuration]

Figure 22:
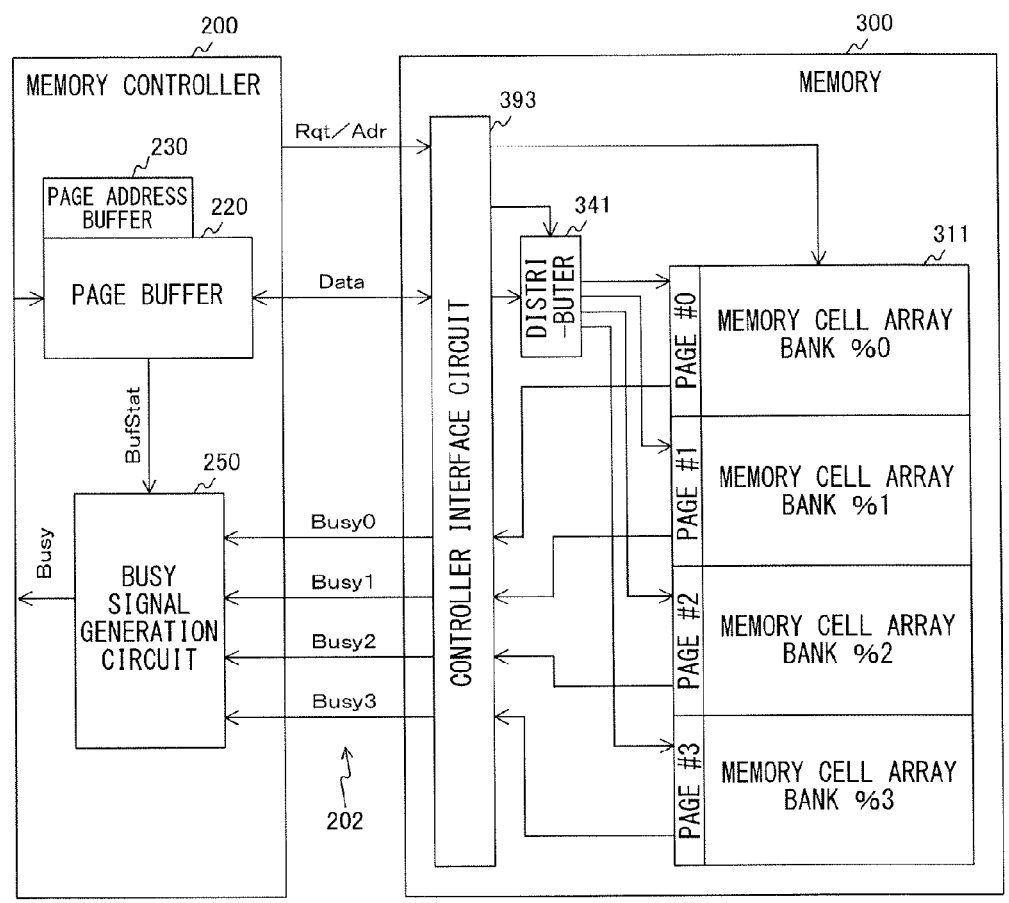
FIG. 22 is a schematic block diagram showing a configuration example of a memory 300 and a memory controller 200 according to a fourth embodiment of the present technology.

FIG. 22 is a schematic block diagram showing a configuration example of a memory 300 and a memory controller 200 according to a fourth embodiment of the present technology. In the fourth embodiment of the present technology, the memory controller 200 is provided with a page buffer 220, a page address buffer 230, and a busy signal generation circuit 250. The operation of each of these component parts is the same as with the above-described third embodiment of the present technology.

As seen from the above, according to the fourth embodiment of the present technology, it is possible to reduce the number of the signal lines for the memory interface 202 by omitting a signal line for the Bufstat signal from the memory interface 202.

(5. Fifth Embodiment)
[Memory Configuration]

Figure 23:
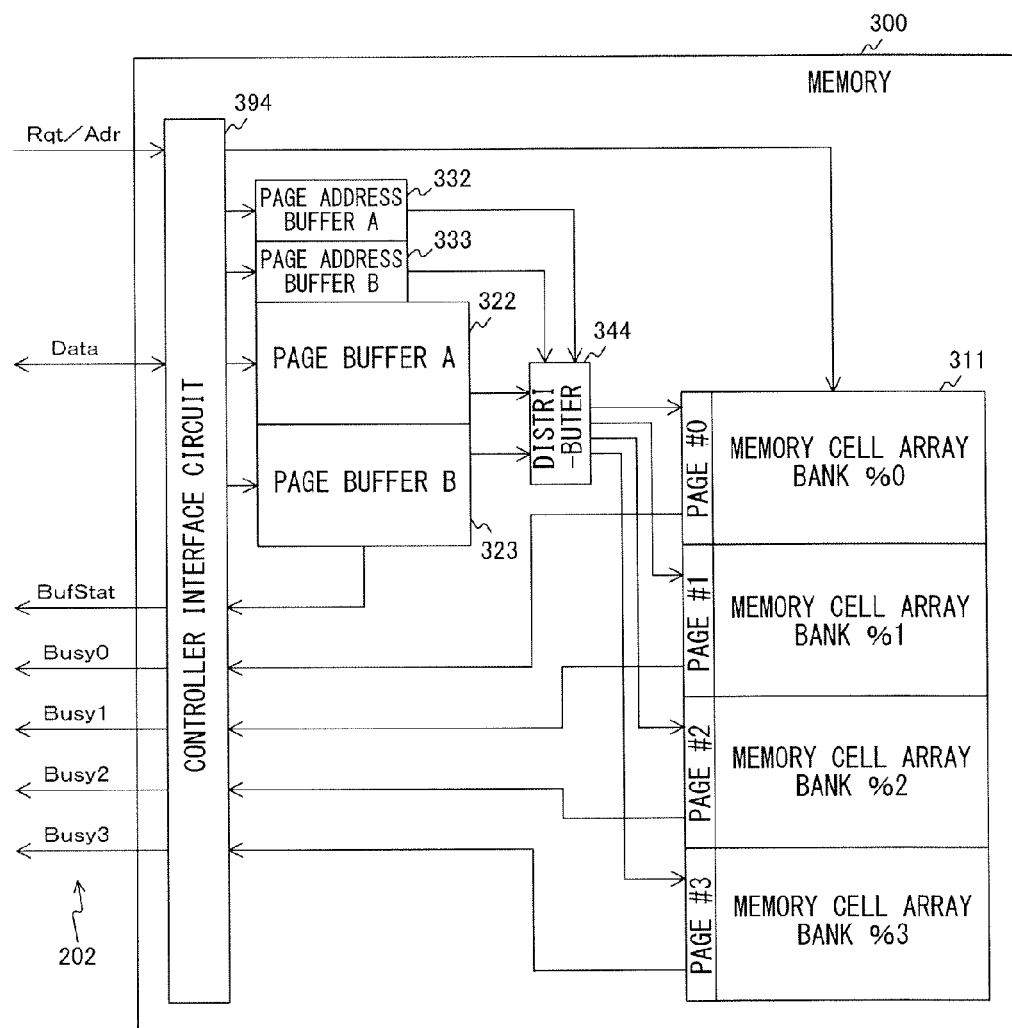
FIG. 23 is a schematic block diagram showing a configuration example of a memory 300 according to a fifth embodiment of the present technology.

FIG. 23 is a schematic block diagram showing a configuration example of a memory 300 according to a fifth embodiment of the present technology. As with the second embodiment of the present technology, this memory 300 includes a memory cell array 311, a distributor 344, and a controller interface circuit 394. As an exception, however, the memory 300 also includes two page buffers A322 and B323, as well as corresponding page address buffers A332 and B333, respectively.

In the fifth embodiment of the present technology, unlike the second embodiment of the present technology, the delay in a processing operation that is caused due to a busy state of banks is improved by increasing a capacity of the page buffers. The number of the page buffers that is necessary to maintain the performance depends on the variation property in a write busy time of a memory of interest. This example shows a configuration on the assumption that a write busy time for two banks or less increases when a write processing operation of four banks is performed.

As described above, according to the fifth embodiment of the present technology, it is possible to improve the delay in a processing operation that is caused due to a busy state of banks by increasing a capacity of the page buffers.

(6. Sixth Embodiment)
[Memory Configuration]

Figure 24:
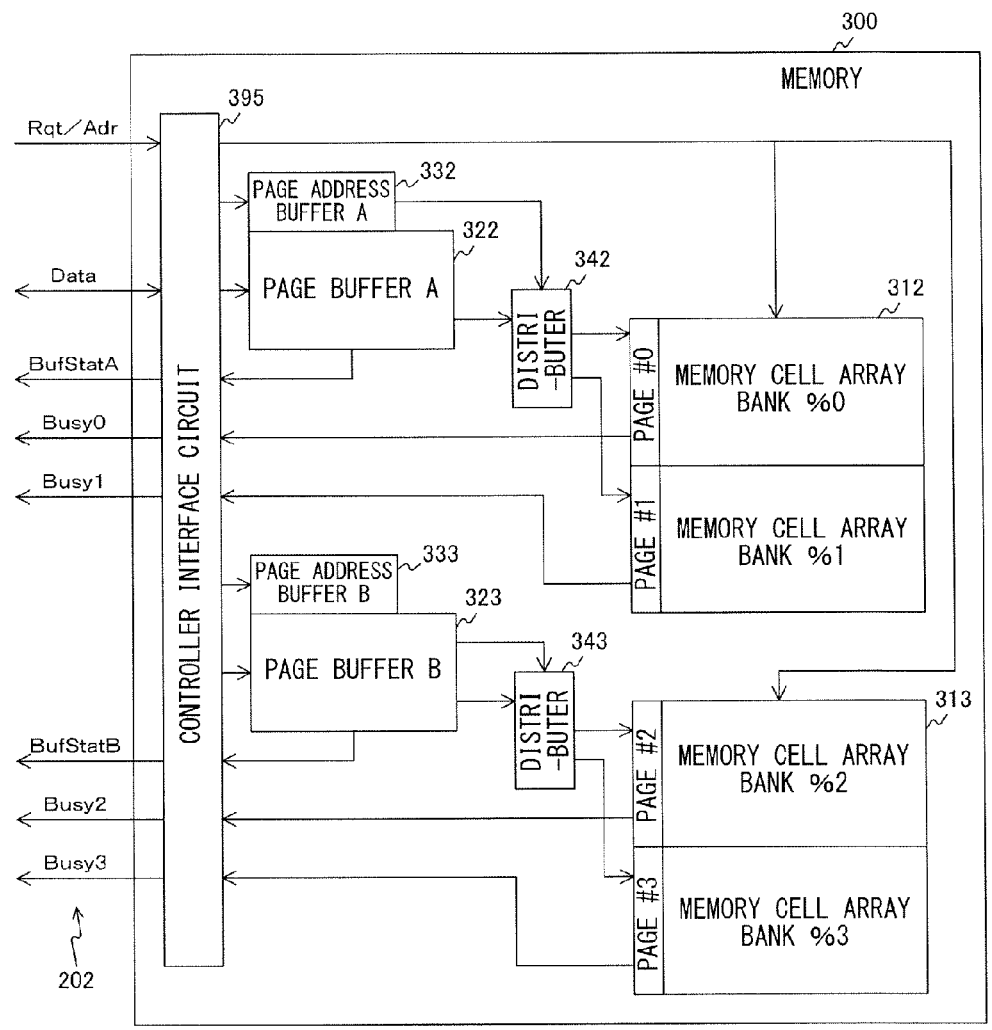
FIG. 24 is a schematic block diagram showing a configuration example of a memory 300 according to a sixth embodiment of the present technology.

FIG. 24 is a schematic block diagram showing a configuration example of a memory 300 according to a sixth embodiment of the present technology. In this memory 300, a memory cell array is divided into two memory cell arrays 312 and 313, each of which includes page buffers A322 and B323, page address buffers A332 and B333, as well as distributors 342 and 343.

In the sixth embodiment of the present technology, a capacity of the page buffers is increased as with the fifth embodiment of the present technology, although the arrangement on a chip is facilitated by limiting the number of memory cell bank arrays to be connected with the page buffers.

As seen from the above, according to the above-described example embodiments of the present technology, provision of the partial unit buffer 32 (subpage buffer 320, page buffer 321, and the like) allows a write processing operation to be continued to the extent possible even when a busy state is indicated for a part of write unit. This makes it possible to improve deterioration in the write performance that is caused by a random variation in the busy time.

It is to be noted that the above-described embodiments give an example for embodying the present technology, and the matters in the embodiments and the elements in the appended claims have a correspondence relationship with respect to each other. In the same manner, the elements in the appended claims and the matters in the example embodiments that are given the same names as those of the elements have a correspondence relationship with respect to each other. However, the present technology is not limited to the above-described embodiments, but may be embodied by giving different variations to embodiments insofar as they are within the scope of the substance thereof.

Further, the processing steps described in the above-described embodiments of the present technology may be considered as methods having a set of these steps, or may be considered as programs for making a computer run a set of these steps or recording media for storing such programs. As the recording media, for example, CD (Compact Disc), MD (MiniDisc), DVD (Digital Versatile Disc), memory card, Blu-ray Disk (Registered trademark), and the like may be used.

Furthermore, the technology encompasses any possible combination of some or all of the various embodiments described herein and incorporated herein.

It is possible to achieve at least the following configurations from the above-described example embodiments of the disclosure.

(1) A storage control device, including:
a partial unit buffer configured to hold at least one data assigned to a partial unit, the partial unit being one of a plurality of partial units that are each a division of a write unit for a memory; and
a request generation section configured to generate, upon indication of a busy state in the memory for any of the partial units, a write request for the write unit of the memory when the holding of the data assigned to that partial unit is possible in the partial unit buffer.

(2) The storage control device according to (1), further including a write control section configured to, upon the generation of the write request, cause the partial unit buffer to hold the data assigned to the partial unit for which the memory indicates the busy state, and transfer to the memory the data assigned to the partial unit for which the memory does not indicate the busy state.

(3) The storage control device according to (2), wherein, when subsequent data assigned to the partial unit for which the busy state is cancelled is held in the partial unit buffer, the write control section transfers the subsequent data from the partial unit buffer to the memory.

(4) The storage control device according to any one of (1) to (3), further including a signal generation section configured to generate a signal, the signal indicating: the busy state when the partial unit for which the busy state is indicated in the memory is present and the holding of the data assigned to that partial unit is not possible in the partial unit buffer; a ready state when the partial unit buffer is in an empty state and none of the partial units for which the busy state is indicated in the memory is present; and the ready state when the holding of, upon the presence of the partial unit for which the busy state is indicated in the memory, the data of that partial unit is possible in the partial unit buffer,
wherein the request generation section generates the write request for the write unit when the signal indicates the ready state.

(5) The storage control device according to any one of (1) to (4), wherein the partial unit buffer holds a plurality of pieces of the data assigned to the partial unit.

(6) A storage device, including:
a memory cell array in which a write unit is divided into a plurality of partial units to store data;
a partial unit buffer configured to hold at least one data assigned to a partial unit of the plurality of partial units;
a request generation section configured to generate, upon indication of a busy state in the memory cell array for any of the partial units, a write request for the write unit of the memory cell array when the holding of the data assigned to that partial unit is possible in the partial unit buffer; and
a write control section configured to, upon the generation of the write request, cause the partial unit buffer to hold the data assigned to the partial unit for which the busy state is indicated, and transfer to the memory cell array the data assigned to the partial unit for which the busy state is not indicated.

(7) The storage device according to (6), wherein the memory cell array includes a memory cell having a non-volatile memory element.

(8) An information processing system, including:
a memory cell array in which a write unit is divided into a plurality of partial units to store data;
a host computer configured to issue a write command for the write unit;
a partial unit buffer configured to hold at least one data assigned to a partial unit of the plurality of partial units;
a request generation section configured to generate, upon indication of a busy state in the memory cell array for any of the partial units, a write request for the write unit of the memory cell array when the holding of the data assigned to that partial unit is possible in the partial unit buffer, upon the issuance of the write command; and
a write control section configured to, upon the generation of the write request, cause the partial unit buffer to hold the data assigned to the partial unit for which the busy state is indicated, and transfer to the memory cell array the data assigned to the partial unit for which the busy state is not indicated.

(9) A storage control method, including:
generating, upon indication of a busy state in a memory for any of partial units that are each a division of a write unit for the memory, a write request for the write unit of the memory when holding of data assigned to that partial unit is possible in a partial unit buffer; and
performing a write control that, upon the generation of the write request, causes the partial unit buffer to hold the data assigned to the partial unit for which the busy state is indicated, and transfers to the memory the data assigned to the partial unit for which the busy state is not indicated.

It should be understood by those skilled in the art that various modifications, combinations, sub-combinations and alterations may occur depending on design requirements and other factors insofar as they are within the scope of the appended claims or the equivalents thereof.

What is claimed is:

1. A storage control device, comprising:
a partial unit buffer configured to hold at least one data assigned to a partial unit, the partial unit being one of a plurality of partial units that are each a division of a write unit for a memory;
a request generation section configured to generate, upon indication of a busy state in the memory for any of the partial units, a write request for the write unit of the memory in an event the holding of the data assigned to that partial unit is possible in the partial unit buffer; and
a signal generation section configured to generate a signal which indicates a busy state for writing in an event the partial unit for which the busy state is indicated in the memory is present and the holding of the data assigned to that partial unit is not possible in the partial unit buffer,
wherein in an event the partial unit buffer is in a busy state, the request generation section is placed in a standby state instead of generating the write request.

2. The storage control device according to claim 1, wherein the signal generation section is further configured to generate a signal, the signal indicating:
a ready state of writing in an event the partial unit buffer is in an empty state and none of the partial units for which the busy state is indicated in the memory is present; and
the ready state of writing in an event the holding of, upon the presence of the partial unit for which the busy state is indicated in the memory, the data of that partial unit is possible in the partial unit buffer,
wherein the request generation section is configured to generate the write request for the write unit in an event the signal indicates the ready state.

3. The storage control device according to claim 1, wherein the partial unit buffer is configured to hold a plurality of pieces of the data assigned to the partial unit.

4. The storage control device according to claim 1, further comprising a write control section configured to, upon the generation of the write request, cause the partial unit buffer to hold the data assigned to the partial unit for which the memory indicates the busy state, and transfer to the memory the data assigned to the partial unit for which the memory does not indicate the busy state.

5. The storage control device according to claim 4, wherein, in an event subsequent data assigned to the partial unit for which the busy state is cancelled is held in the partial unit buffer, the write control section is configured to transfer the subsequent data from the partial unit buffer to the memory.

6. A storage device, comprising:
a memory cell array in which a write unit is divided into a plurality of partial units to store data;
a partial unit buffer configured to hold at least one data assigned to a partial unit of the plurality of partial units;
a request generation section configured to generate, upon indication of a busy state in the memory cell array for any of the partial units, a write request for the write unit of the memory cell array in an event the holding of the data assigned to that partial unit is possible in the partial unit buffer;
a signal generation section configured to generate a signal which indicates a busy state for writing in an event the partial unit for which the busy state is indicated in the memory is present and the holding of the data assigned to that partial unit is not possible in the partial unit buffer; and
a write control section configured to, upon the generation of the write request, cause the partial unit buffer to hold the data assigned to the partial unit for which the busy state is indicated, and transfer to the memory cell array the data assigned to the partial unit for which the busy state is not indicated,
wherein in an event the partial unit buffer is in a busy state, the request generation section is placed in a standby state instead of generating the write request.

7. The storage device according to claim 6, wherein the memory cell array includes a memory cell having a non-volatile memory element.

8. An information processing system, comprising:
a memory cell array in which a write unit is divided into a plurality of partial units to store data;
a host computer configured to issue a write command for the write unit;
a partial unit buffer configured to hold at least one data assigned to a partial unit of the plurality of partial units;
a request generation section configured to generate, upon indication of a busy state in the memory cell array for any of the partial units, a write request for the write unit of the memory cell array in an event the holding of the data assigned to that partial unit is possible in the partial unit buffer, upon the issuance of the write command;
a signal generation section configured to generate a signal which indicates a busy state for writing in an event the partial unit for which the busy state is indicated in the memory is present and the holding of the data assigned to that partial unit is not possible in the partial unit buffer; and
a write control section configured to, upon the generation of the write request, cause the partial unit buffer to hold the data assigned to the partial unit for which the busy state is indicated, and transfer to the memory cell array the data assigned to the partial unit for which the busy state is not indicated,
wherein in an event the partial unit buffer is in a busy state, the request generation section is placed in a standby state instead of generating the write request.

9. A storage control method, comprising:
generating, upon indication of a busy state in a memory for any of partial units that are each a division of a write unit for the memory, a write request for the write unit of the memory in an event holding of data assigned to that partial unit is possible in a partial unit buffer;
generating, in an event the partial unit for which the busy state is indicated in the memory is present and the holding of the data assigned to that partial unit is not possible in the partial unit buffer, a signal which indicates a busy state for writing; and
performing a write control that, upon the generation of the write request, causes the partial unit buffer to hold the data assigned to the partial unit for which the busy state is indicated, and transfers to the memory the data assigned to the partial unit for which the busy state is not indicated,
wherein in an event the partial unit buffer is in a busy state, the write request is not generated.

* * * * *